United States Patent
Kwak et al.

(10) Patent No.: US 9,564,241 B2
(45) Date of Patent: Feb. 7, 2017

(54) MEMORY SYSTEM AND USER DEVICE INCLUDING THE SAME

(71) Applicants: Donghun Kwak, Hwaseong-si (KR); Kitae Park, Seongnam-si (KR)

(72) Inventors: Donghun Kwak, Hwaseong-si (KR); Kitae Park, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 225 days.

(21) Appl. No.: 14/466,187

(22) Filed: Aug. 22, 2014

(65) Prior Publication Data
US 2015/0153955 A1 Jun. 4, 2015

(30) Foreign Application Priority Data
Dec. 4, 2013 (KR) .......................... 10-2013-0150114

(51) Int. Cl.
| | |
|---|---|
| G06F 12/12 | (2016.01) |
| G11C 16/34 | (2006.01) |
| G11C 16/04 | (2006.01) |
| G11C 16/26 | (2006.01) |
| G06F 3/06 | (2006.01) |
| G06F 12/02 | (2006.01) |

(52) U.S. Cl.
CPC ......... *G11C 16/349* (2013.01); *G11C 16/0466* (2013.01); *G11C 16/26* (2013.01); *G06F 12/0246* (2013.01); *G06F 2003/0697* (2013.01)

(58) Field of Classification Search
CPC .............. G06F 12/0822; G06F 12/0811; G06F 11/3409

USPC ........................................................ 711/130
See application file for complete search history.

(56) References Cited

U.S. PATENT DOCUMENTS

| | | |
|---|---|---|
| 6,858,906 B2 | 2/2005 | Lee et al. |
| 7,616,496 B2 | 11/2009 | Choi et al. |
| 7,623,366 B2 | 11/2009 | Park et al. |
| 7,978,521 B2 | 7/2011 | Son et al. |
| 8,203,885 B2 | 6/2012 | Abiko et al. |
| 8,250,324 B2 * | 8/2012 | Haas ................... G06F 11/1446 711/156 |

(Continued)

FOREIGN PATENT DOCUMENTS

| | | |
|---|---|---|
| JP | 2008-226421 A | 9/2008 |
| JP | 2011-181156 A | 9/2011 |

(Continued)

*Primary Examiner* — Jae Yu
(74) *Attorney, Agent, or Firm* — Harness, Dickey & Pierce, P.L.C.

(57) ABSTRACT

In one embodiment, the method includes receiving a read request for reading data from a memory area of the memory, and determining whether an identifier of the memory area is stored in one of the plurality of entries of a characteristic table. Each of the plurality of entries is associated with a different range of at least one memory area characteristic and each of the plurality of entries is associated with different read condition information. The method further includes obtaining the read condition information associated with the entry storing the identifier of the memory area if the determining determines the identifier is stored in one of the plurality of entries of the characteristic table, and controlling the memory to read data from the memory area using the obtained read condition information.

19 Claims, 23 Drawing Sheets

(56) References Cited

U.S. PATENT DOCUMENTS

| | | |
|---|---|---|
| 8,386,868 B2 | 2/2013 | Lasser |
| 8,484,407 B2 | 7/2013 | Haukness et al. |
| 8,493,788 B2 | 7/2013 | Namiki et al. |
| 2003/0047755 A1 | 3/2003 | Lee et al. |
| 2004/0169238 A1 | 9/2004 | Lee et al. |
| 2006/0180851 A1 | 8/2006 | Lee et al. |
| 2007/0205445 A1 | 9/2007 | Park et al. |
| 2008/0225595 A1 | 9/2008 | Choi et al. |
| 2009/0265598 A1 | 10/2009 | Lasser |
| 2009/0287975 A1 | 11/2009 | Kim et al. |
| 2009/0323419 A1* | 12/2009 | Lee .................. G06F 12/0246 365/185.11 |
| 2010/0008146 A1 | 1/2010 | Son et al. |
| 2010/0010040 A1 | 1/2010 | Jones et al. |
| 2010/0062715 A1 | 3/2010 | Kim et al. |
| 2010/0088574 A1 | 4/2010 | Kim et al. |
| 2010/0309237 A1 | 12/2010 | Roh |
| 2010/0315325 A1 | 12/2010 | Hwang |
| 2011/0170349 A1 | 7/2011 | Avraham et al. |
| 2011/0191526 A1 | 8/2011 | Haukness et al. |
| 2011/0216599 A1 | 9/2011 | Namiki et al. |
| 2011/0267884 A1 | 11/2011 | Abiko et al. |
| 2012/0008414 A1 | 1/2012 | Katz et al. |
| 2012/0144145 A1 | 6/2012 | Shin |
| 2013/0017629 A1 | 1/2013 | Pyo et al. |
| 2013/0051146 A1 | 2/2013 | Yun et al. |

FOREIGN PATENT DOCUMENTS

| | | |
|---|---|---|
| KR | 10-0673020 B1 | 1/2007 |
| KR | 10-2009-0119117 A | 11/2009 |
| KR | 10-2010-0006712 A | 1/2010 |
| KR | 10-2012-0062075 A | 6/2012 |

\* cited by examiner

Fig. 9
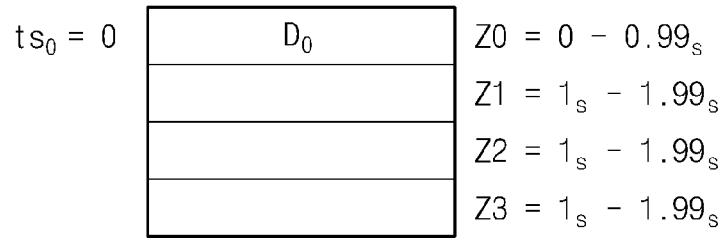
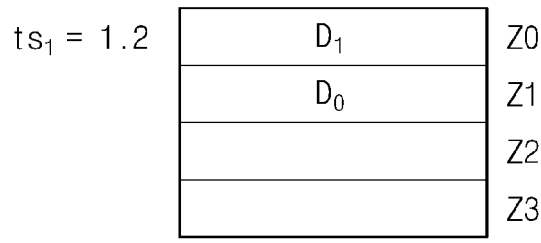
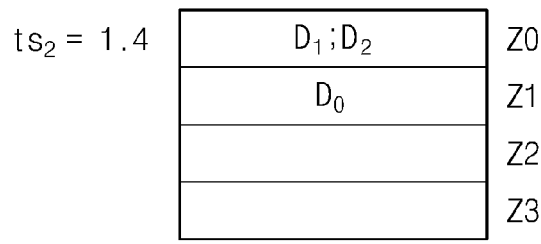
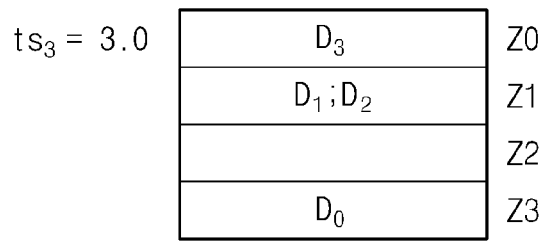
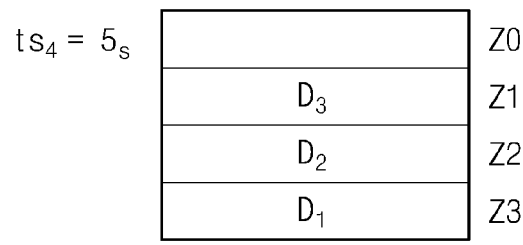

MEMORY SYSTEM AND USER DEVICE INCLUDING THE SAME

CROSS-REFERENCE TO RELATED APPLICATIONS

A claim for priority under 35 U.S.C. §119 is made to Korean Patent Application No. 10-2013-0150114 filed Dec. 4, 2013, in the Korean Intellectual Property Office, the entire contents of which are hereby incorporated by reference.

BACKGROUND

The inventive concepts described herein relate to a semiconductor memory device, and more particularly, relate to a nonvolatile memory device and/or a memory controller to control the nonvolatile memory device.

Semiconductor memories are usually considered to be the most vital microelectronic component of digital logic system design, such as computers and microprocessor-based applications ranging from satellites to consumer electronics. Therefore, advances in the fabrication of semiconductor memories including process enhancements and technology developments through scaling for higher densities and faster speeds help establish performance standards for other digital logic families.

Semiconductor memory devices may be characterized as volatile random access memories (RAMs), or non-volatile memory devices. In RAMs, the logic information is stored either by setting the logic state of a bistable flip-flop such as in a static random access memory (SRAM), or through the charging of a capacitor as in a dynamic random access memory (DRAM). In either case, the data are stored and can be read out as long as the power is applied, and the data are lost when the power is turned off; hence, these memories are called volatile memories.

Non-volatile memories, such as Mask Read-Only Memory (MROM). Programmable Read-Only Memory (PROM), Erasable Programmable Read-Only Memory (EPROM), and Electrically Erasable Programmable Read-Only Memory (EEPROM), are capable of storing the data, even with the power is turned off. The non-volatile memory data storage mode may be permanent or reprogrammable, depending upon the fabrication technology used. Non-volatile memories are used for program and microcode storage in a wide variety of applications in the computer, avionics, telecommunications, and consumer electronics industries. A combination of single-chip volatile as well as non-volatile memory storage modes is also available in devices such as non-volatile SRAM (nvSRAM) for use in systems that require fast, programmable non-volatile memory. In addition, dozens of special memory architectures have evolved, which contain some additional logic circuitry to optimize their performance for application-specific tasks.

A Charge Trap Flash (CTF) technology is being applied to a nonvolatile memory device. The CTF technology is a semiconductor memory technique used to implement non-volatile NOR and NAND flash memories. The CTF technology is different from conventional floating gate MOSFET technology in that it uses a silicon nitride film to store electrons rather than the doped polycrystalline silicon typical of a floating gate structure. This approach allows memory manufacturers to reduce manufacturing costs five ways: (1) Fewer process steps are required to form a charge storage node, (2) Smaller process geometries can be used (therefore reducing chip size and cost), (3) Multiple bits can be stored on a single flash memory cell, (4) Improved reliability, and (5) Higher yield since the charge trap is less susceptible to point defects in the tunnel oxide layer.

SUMMARY

At least one embodiment relates to a method of reading from a memory.

In one embodiment, the method includes receiving a read request for reading data from a memory area of the memory, and determining whether an identifier of the memory area is stored in one of the plurality of entries of a characteristic table. Each of the plurality of entries is associated with a different range of at least one memory area characteristic and each of the plurality of entries is associated with different read condition information. The method further includes obtaining the read condition information associated with the entry storing the identifier of the memory area if the determining determines the identifier is stored in one of the plurality of entries of the characteristic table, and controlling the memory to read data from the memory area using the obtained read condition information.

At least one embodiment relates to a method of managing read condition information.

In one embodiment, the method includes storing an identifier of a memory area in one of a plurality of entries of a characteristic table. Each of the plurality of entries is associated with a different range of at least one memory area characteristic and each of the plurality of entries is associated with different read condition information. The storing stores the identifier in the one of the plurality of entries based on the memory area characteristic of the memory area.

At least one embodiment relates to a memory controller.

In one embodiment, the memory controller includes a buffer configured to store a characteristic table. The characteristic table includes a plurality of entries. Each of the plurality of entries is associated with a different range of at least one memory area characteristic and each of the plurality of entries is associated with different read condition information. The memory controller further includes a processor configured to receive a read request for reading data from a memory area of the memory, determine whether an identifier of the memory area is stored in one of the plurality of entries of the characteristic table, obtain the read condition information associated with the entry storing the identifier of the memory area if the determining determines the identifier is stored in one of the plurality of entries of the characteristic table, and control the memory to read data from the memory area using the obtained read condition information.

In another embodiment, the memory controller includes a buffer and a processor configured to store an identifier of a memory area in one of a plurality of entries of a characteristic table stored in the buffer. Each of the plurality of entries is associated with a different range of at least one memory area characteristic and each of the plurality of entries is associated with different read condition information, and the processor configured to store the identifier in the one of the plurality of entries based on the memory area characteristic of the memory area.

BRIEF DESCRIPTION OF THE FIGURES

The above and other objects and features will become apparent from the following description with reference to the following figures, wherein like reference numerals refer to like parts throughout the various figures unless otherwise specified, and wherein

FIG. 9 illustrates an example of the time mark table changing over time;

DETAILED DESCRIPTION

Figure 1:
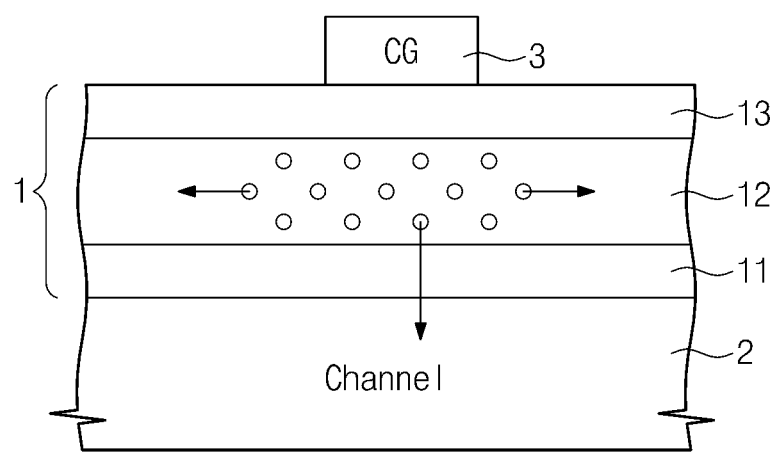
FIG. 1 is a diagram schematically illustrating a vertical structure of a charge trap flash cell.

Embodiments will be described in detail with reference to the accompanying drawings. The inventive concepts, however, may be embodied in various different forms, and should not be construed as being limited only to the illustrated embodiments. Rather, these embodiments are provided as examples so that this disclosure will be thorough and complete, and will fully convey the concepts of the inventive concepts to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a diagram schematically illustrating a vertical structure of a charge trap flash cell.

Referring to FIG. 1, a Charge Trap Flash cell (hereinafter, referred to as "CTF cell") has an information storage layer 1 to store information. The information storage layer 1 includes a first oxide film 11, a nitride film 12, and a second oxide film 13 that are sequentially stacked on a channel 2. Here, the nitride film 12 may be used as a charge trap layer. The CTF cell is programmed by applying a program voltage to a control gate 3 and a predetermined voltage (e.g., 0V) to the channel 2 of the CTF cell. The channel 2 may be a semiconductor material (e.g., silicon). An electric field is formed in a direction from the control gate 3 into the channel 2 under the bias condition; therefore, charges are shifted into the charge trap layer 12 from the channel 2 by the electric field. Thus, the CTF cell is programmed under this bias condition. The CTF cell is erased by applying a predetermined voltage (e.g., 0V or a voltage higher than 0V) to the control gate 3 and an erase voltage (e.g., about 20V) to the channel 2 of the CTF cell. As an electric field is formed in a direction from a bulk into the control gate under this bias condition, the CTF cell is erased.

In FIG. 1, locations of charges trapped in the charge trap layer 12 through programming are exemplary. It is understood that their locations are variable according to a characteristic of the CTF cell. As a time elapses, charges trapped in the charge trap layer 12 through programming may decrease due to various phenomenon such as charge rearrangement, loss into the channel 2 (refer to an arrow shown in a vertical direction in FIG. 1), migration through the nitride film 12 (refer to an arrow shown in a horizontal direction in FIG. 1), and so on. This is referred to as a fast charge loss phenomenon. If the fast charge loss phenomenon occurs, a threshold voltage of the CTF cell may become low. Also, dropping and spreading on a distribution of threshold voltages of programmed CTF cells may occur.

Figure 2:
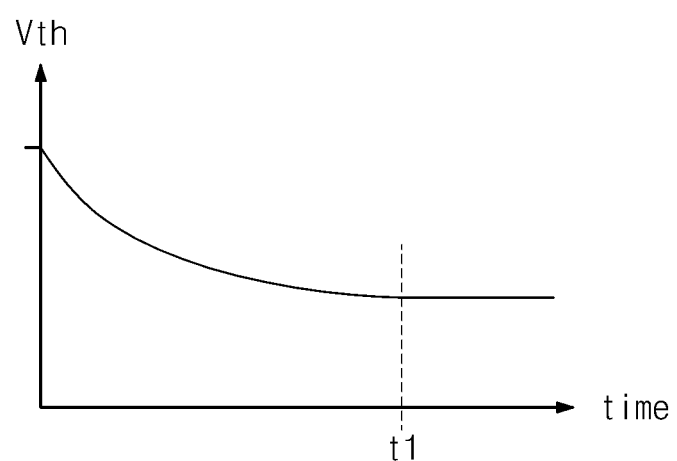
FIG. 2 is a diagram showing a variation in threshold voltage of a CTF cell due to a fast charge loss phenomenon.
Figure 3:
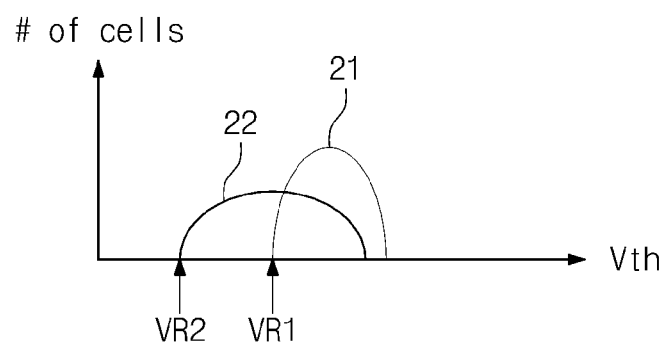
FIG. 3 is a diagram showing threshold voltage distributions varied according to a fast charge loss phenomenon.

FIG. 2 is a diagram showing a variation in threshold voltage of a CTF cell due to a fast charge loss phenomenon. FIG. 3 is a diagram showing threshold voltage distributions varied according to a fast charge loss phenomenon.

In FIG. 2, a horizontal axis indicates an elapsed time after a program operation is performed, and a vertical axis indicates a threshold voltage of a programmed CTF cell. A CTF cell may have a target threshold voltage (e.g., a voltage equal to or higher than a verification voltage) immediately after a program operation is completed. As a time elapses after a program operation is completed, a threshold voltage of the CTF cell may gradually decrease as shown in FIG. 2. The reason is that loss of trapped charges in a charge trap layer due to the above-described fast charge loss phenomenon arises. Charges thus lost affect a threshold voltage of the CTF cell. For example, a threshold voltage of the CTF cell may decrease. A variation in threshold voltage of the CTF cell means that read fail occurs. As illustrated in FIG. 2, a threshold voltage of a programmed CTF cell continuously varies until a stabilization time t1 elapses, but it does not vary after the stabilization time t1 elapses. Although such an example that a threshold voltage of a programmed CTF cell does not vary after the stabilization time t1 is illustrated in FIG. 2, its threshold voltage may vary after the stabilization time t1. Here, it is noted that the inventive concepts relate to a variation in threshold voltage of a programmed CTF cell due to the fast charge loss phenomenon. A shape of a graph indicating a variation in threshold voltage is exemplary, and the inventive concepts are not limited thereto.

Referring to FIG. 3, threshold voltages of programmed CTF cells form a threshold voltage distribution (or, a target threshold voltage distribution) corresponding to "21" immediately after a program operation is executed. Data of CTF cells included in the threshold voltage distribution 21 is read using a read voltage VR1. In this case, data of the CTF cell is normally read. Threshold voltages of the programmed CTF cells form a threshold voltage distribution corresponding to "22" after the stabilization time t1 elapses. If data of CTF cells included in the threshold voltage distribution 22 is read using the read voltage VR1, it may not be read normally. That is, read fail may arise.

If a read operation is performed using a read voltage VR2 decided on the basis of the threshold voltage distribution 22 formed after a program operation is performed and then the stabilization time t1 elapses, the read operation may be normally performed. However, if a read operation is performed before the stabilization time t1 elapses, as described above, the read fail may occur if read voltage VR2 is used. This means that a read condition (e.g., a read voltage) for a read operation to be performed between a program completion time and the stabilization time t1 has to be changed. This will be more fully described later. The inventive concepts relate to controlling a read condition (e.g., read voltage or a sensing condition) for a read operation to be performed between the program completion time and the stabilization time t1. The read condition for a read operation may be changed based on a time (hereinafter, referred to as "program lapse time") that elapses after a program operation of a CTF cell is completed, for example. It is possible to prevent the read fail due to the fast charge loss phenomenon by changing a read condition according to a program lapse time of a CTF cell. In other words, it is possible to improve or optimize in real time the read condition for determining a threshold voltage of a CTF cell being varied by the fast charge loss phenomenon by changing a read condition according to a program lapse time of the CTF cell.

A variation in threshold voltage shown in FIG. 2 is exemplary. A change speed of a threshold voltage and the stabilization time t1 may not be fixed but changed according to various conditions (e.g., a page, a word line, endurance, a program mode, an erase mode, a read mode, and so on). A change speed of a threshold voltage and the stabilization time t1 may not be limited to specific speed and time. In the inventive concepts, a time interval between a program completion time and the stabilization time t1 is divided into a plurality of time zones considering the change speed of the threshold voltage. Different read conditions are respectively allocated to the time zones. Information about a program completed CTF cell (or, a page including the program completed CTF cell, a word line including the program completed CTF cell, a memory block including the program completed CTF cell, a mat (e.g., a plurality of memory blocks) including the program completed CTF cell, or a chip including the program completed CTF cell) is managed in real time using a time mark table. That is, such information may be stored in the time mark table after a program operation is completed. Afterwards, a page including the program completed CTF cell (or, a word line including the program completed CTF cell, a memory block including the program completed CTF cell, a mat including the program completed CTF cell, or a chip including the program completed CTF cell) may be referred to as a memory area. The time mark table may be managed to selectively include information of a read requested memory area. In the event that the time mark table includes information of a read requested memory area, a read condition of the read requested memory area may be decided in real time based on a time zone TZ of the read requested memory area stored in the time mark table. A read operation may be performed according to the read condition thus decided. Thus, it is possible to reduce or prevent read fail due to the fast charge loss phenomenon.

Figure 4:
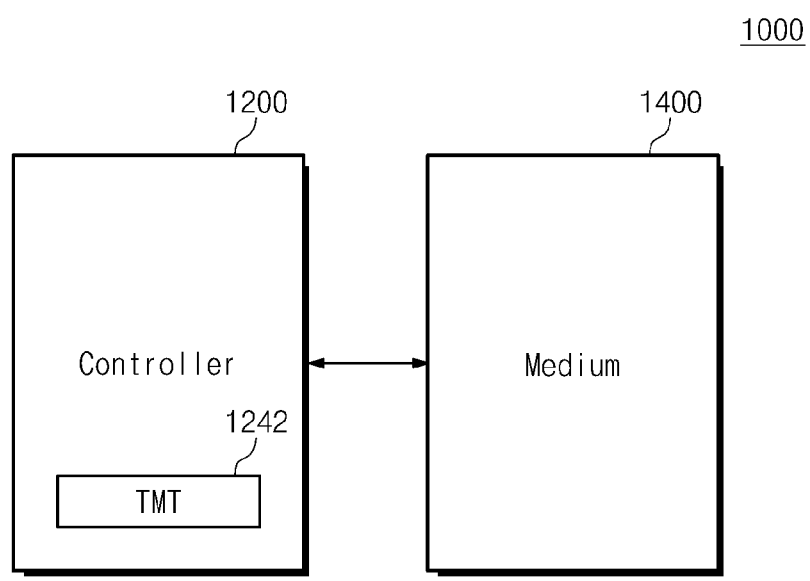
FIG. 4 is a block diagram schematically illustrating a memory system according to an embodiment of the inventive concepts.
Figure 5:
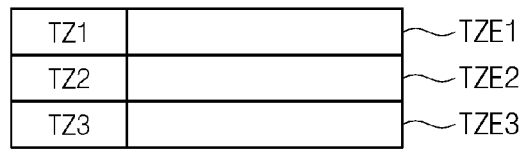
FIG. 5 is a diagram schematically illustrating a time mark table of a memory controller shown in FIG. 4, according to an embodiment of the inventive concepts.

FIG. 4 is a block diagram schematically illustrating a memory system according to an embodiment of the inventive concepts. FIG. 5 is a diagram schematically illustrating a time mark table of a memory controller shown in FIG. 4, according to an embodiment of the inventive concepts.

Referring to FIG. 4, a memory system according to an embodiment of the inventive concepts includes a memory controller 1200 and storage medium 1400 formed of a multi-bit/multi-level nonvolatile memory device. The memory controller 1200 may be configured to control the storage medium 1400 according to an external request (e.g., a write request, a read request, a program lapse time managing operation, and so on). The memory controller 1200 may be configured to control the storage medium 1400 according to an internal request (e.g., an operation associated with sudden power-off, a wear-leveling operation, a read reclaim operation, and so on) without an external request. The storage medium 1400 operates in response to a control of the memory controller 1200 and is used to store data information. The storage medium 1400 may be formed of one or more memory chips. The storage medium 1400 and the memory controller 1200 may communicate with each other through one or more channels. The storage medium 1400 may include a NAND flash memory device, for example. It is understood that a memory device used to implement the storage medium 1400 is not limited to the NAND flash memory device. In particular, a memory device used to implement the storage medium 1400 is formed of CTF cells.

The memory controller 1200 includes a time mark table 1242 for managing a program lapse time of a memory area including a programmed CTF cell. Here, the term "memory area" may be used to indicate a page, a word line, a memory block, a mat, a chip, or the like. The time mark table 1242, as illustrated in FIG. 5, includes a plurality of time zone entries TZEi, each of which may store an identifier (e.g., a physical address) identifying a memory area. A memory area included in each time zone entry may be desirably managed with information suitable to minimize the size of the time mark table 1242. In FIG. 5, there is shown the time mark table 1242 having three time zones. Each time zone entry corresponds to a different range of elapsed time or different range of durations. It is understood that the number of time zones of the time mark table 1242 is not limited to this disclosure. The total of the ranges may correspond to the stabilization time t1 described with reference to FIG. 2. Here, the length of each range respectively corresponding to the time zones may be different from or equal to one another. Alternatively, assuming that the time ranges respectively corresponding to the time zones are divided into a first group and a second group, time ranges belonging to the first group may be different from or equal to one another, and time ranges belonging to the second group may be different from or equal to one another. Also, time ranges belonging to the first group may be different from times belonging to the first group. However, time ranges respectively corresponding to time zones are not limited to this disclosure.

In an exemplary embodiment, the identifier of a programmed memory area may be shifted within the time mark table 1242 according to a program lapse time. For example, the identifier of a specific memory area may be marked in a time zone entry TZE1 immediately after the specific memory area is programmed. After a time corresponding to the end of the time range for time zone TZ1 elapses, the identifier of the specific memory area may be shifted into time zone entry TZE2. At this time, the identifier of the specific memory area recorded in the time zone entry TZE1 may be invalidated or eliminated. After a time corresponding to the end of the time range for time zone TZ2 elapses, the identifier of the specific memory area may be shifted into a time zone entry TZE3. At this time, the identifier of the specific memory area recorded in the time zone entry TZE2 may be invalidated or eliminated. The identifier of the specific memory area may be removed from the time mark table 1242 after a time corresponding the end of the time range for time zone TZ3 elapses. Program lapse times about programmed memory areas may be managed according to this manner.

In one example embodiment, the time zones TZi (i being an integer of 2 or more) may have different read conditions.

Returning to FIG. 4, when a read request is received, the memory controller 1200 determines whether or not the time mark table 1242 includes an identifier of a read requested memory area. In the event that the time mark table 1242 includes the identifier of the read requested memory area, the memory controller 1200 controls the storage medium 1400 to perform the read operation according to read condition information corresponding to a time zone entry in which the identifier of the read requested memory area is marked. The read condition information corresponding to a time zone entry in which the identifier of the read requested memory area is recorded may be provided to the storage medium 1400 in various ways. For example, the read condition information may be provided to the storage medium 1400 using a command, data, a specific pin, etc. If the time mark table 1242 does not include the identifier of the read requested memory area, the memory controller 1200 controls the storage medium 1400 to perform a read operation according to default read condition information (e.g., a read condition corresponding to a threshold voltage distribution 22 shown in FIG. 2).

The memory controller 1200 and the nonvolatile memory device 1400 may constitute a multi-media card (MMC) or an embedded MMC (eMMC) that is directly mounted on a board of a portable electronic device. However, the inventive concepts are not limited thereto.

Figure 6:
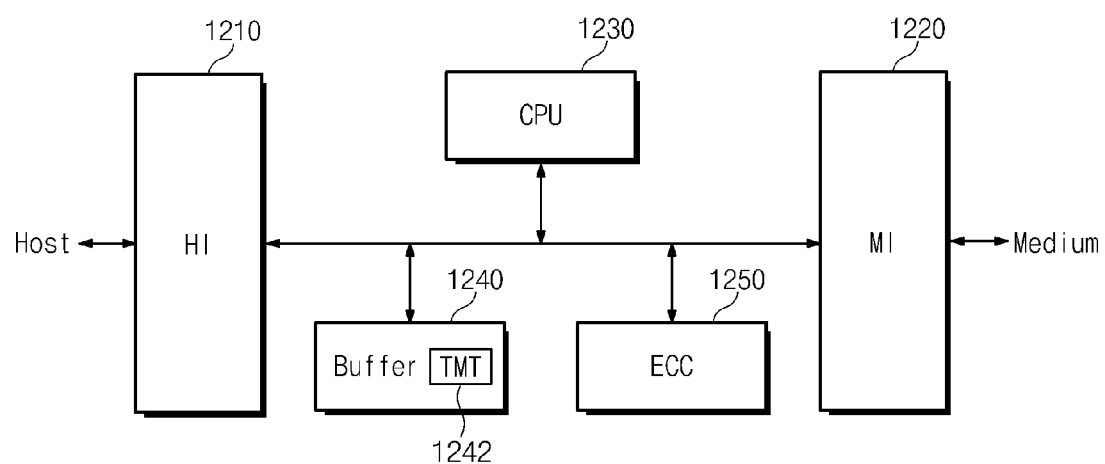
FIG. 6 is a block diagram schematically illustrating a memory controller shown in FIG. 4, according to an embodiment of the inventive concepts.

FIG. 6 is a block diagram schematically illustrating a memory controller shown in FIG. 4, according to an embodiment of the inventive concepts. Referring to FIG. 6, a memory controller 1200 includes a host interface 1210 as a first interface, a memory interface 1220 as a second interface, a central processing unit (CPU) 1230, a buffer memory 1240, and an error detecting and correcting circuit 1250.

The host interface 1210 is configured to interface with an external device (for example, a host), and the memory interface 1220 is configured to interface with storage medium 1400 illustrated in FIG. 4. The CPU 1230 is configured to control an overall operation of the controller 1200. The CPU 1230 may be configured to operate firmware such as Flash Translation Layer (FTL), for example. The FTL may perform a variety of functions. For example, the FTL may include a variety of layers performing a time mark table managing operation, a program lapse time, an address mapping operation, a read reclaim operation, an error correction operation, and so on. For example, the FTL may record the identifier of a program completed memory area in the time mark table 1242 immediately after a program operation about a write requested memory area is completed. The FTL determines whether or not the identifier of a read requested memory area is included in the time mark table 1242 and may decide a read condition of the read requested memory area based on this determination. The read condition thus decided may be transferred to the storage medium 1400 through the memory interface 1220.

The buffer memory 1240 may be used to temporarily store data to be transferred from an external device via the host interface 1210 or data to be transferred from the storage medium 1400 via the memory interface 1220. The buffer memory 1240 is used to store information (e.g., address mapping table and so on) needed to control the storage medium 1400. The buffer memory 1240 may be formed from a DRAM, SRAM, or a combination of DRAM and SRAM. However, the use of the buffer memory 1240 according to the inventive concepts is not limited thereto. The buffer memory 1240 includes the time mark table 1242. However, the inventive concepts are not limited to the time mark table 1242 being stored in the buffer memory 1240. For example, the time mark table 1242 may be managed using a separate memory. The time mark table 1242 may be backed up in the storage medium 1400. The ECC 1250 may be configured to encode data to be stored in the storage medium 1400 and to decode data read out from the storage medium 1400.

Although not illustrated in the figures, the memory controller 1200 may further include a randomizer/de-randomizer, which is configured to randomize data to be stored in the nonvolatile memory device 1400 and to de-randomize data read from the nonvolatile memory device 1400. An example of the randomizer/de-randomizer is disclosed in U.S. Patent Publication No. 2010/0088574, the entire contents of which are hereby incorporated by reference.

In example embodiments, the host interface 1210 may comply with one of computer bus standards, storage bus standards, iFCPPeripheral bus standards, or a combination of two or more standards. The computer bus standards may include S-100 bus, Mbus, Smbus, Q-Bus, ISA, Zorro II, Zorro III, CAMAC, FASTBUS, LPC, EISA, VME, VXI, NuBus, TURBOchannel, MCA, Sbus, VLB, PCI, PXI, HP GSC bus, CoreConnect, InfiniBand, UPA, PCI-X, AGP, PCIe, Intel QuickPath Interconnect, Hyper Transport, and the like. The storage bus standards may include ST-506, ESDI, SMD, Parallel ATA, DMA, SSA, HIPPI, USB MSC, FireWire(1394), Serial ATA, eSATA, SCSI, Parallel SCSI, Serial Attached SCSI, Fibre Channel, iSCSI, SAS, RapidIO, FCIP, etc. The iFCPPeripheral bus standards may include Apple Desktop Bus, HIL, MIDI, Multibus, RS-232, DMX512-A, EIA/RS-422, IEEE-1284, UNI/O, 1-Wire, I2C, SPI, EIA/RS-485, USB, Camera Link, External PCIe, Light Peak, Multidrop Bus, and the like.

Figure 7:
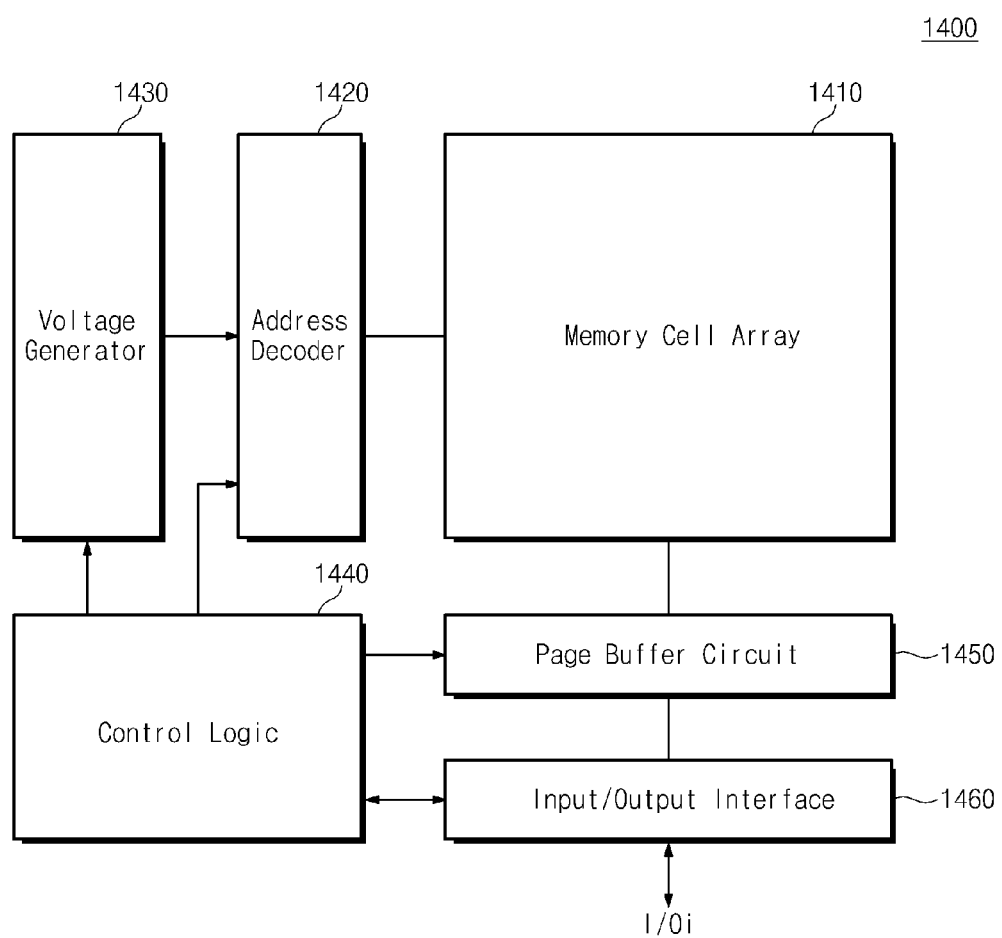
FIG. 7 is a block diagram schematically illustrating storage medium shown in FIG. 4, according to an embodiment of the inventive concepts.

FIG. 7 is a block diagram schematically illustrating storage medium shown in FIG. 4, according to an embodiment of the inventive concepts.

Storage medium 1400 may be a NAND flash memory device, for example. However, it is well understood that the storage medium 1400 is not limited to the NAND flash memory device. In particular, memory cells included in the storage medium 1400 may be CTF cells. Also, the storage medium 1400 of the inventive concepts may be implemented to have a three-dimensional array structure. A non-volatile memory device with the three-dimensional array structure may be referred to as a vertical NAND flash memory device. Examples of the vertical NAND flash memory device are disclosed in U.S. Patent Publication Nos. 2013/0017629 and 2013/0051146, the entire contents of which are hereby incorporated by reference.

Referring to FIG. 7, the storage medium 1400 includes a memory cell array 1410, an address decoder 1420, a voltage generator 1430, control logic 1440, a page buffer circuit 1450, and an input and output interface 1460.

The memory cell array 1410 may include memory cells arranged at intersections of rows (e.g., word lines) and columns (e.g., bit lines). Memory cells connected to the same word line are referred to as a page. Each memory cell may store 1-bit data or M-bit data as multi-bit data (M being an integer of 2 or more). The address decoder 1420 is controlled by the control logic 1440, and the address decoder 1420 performs selecting and driving operations for rows (e.g., word lines, a string selection line(s), a ground selection line(s), a common source line, etc.) of the memory cell array 1410. The voltage generator 1430 is controlled by the control logic 1440, and the voltage generator 1430 generates voltages required for each operation such as a high voltage, a program voltage, a read voltage, a verification voltage, an erase voltage, a pass voltage, a bulk voltage, and the like. Voltages generated by the voltage generator 1430 may be provided to the memory cell array 1410 via the address decoder 1420. The control logic 1440 is configured to control an overall operation of the storage medium 1400.

The page buffer circuit 1450 is controlled by the control logic 1440, and the page buffer circuit 1450 is configured to read data from the memory cell array 1410 and to drive columns (e.g., bit lines) of the memory cell array 1410 according to program data. The page buffer circuit 1450 may include page buffers respectively corresponding to bit lines or bit line pairs. Each of the page buffers may include a plurality of latches. The input and output interface 1460 is controlled by the control logic 1440, and this interface 1460 interfaces with an external device (e.g., a memory controller 1200 shown in FIG. 6). Although not illustrated in FIG. 7, the input and output interface 1460 may include a column decoder configured to select page buffers of the page buffer circuit 1450 by a desired (or, alternatively a predetermined) unit, an input buffer configured to receive data, an output buffer configured to output data, and so on.

The control logic 1440 performs a read operation according to a read condition from the memory controller 1200. The read condition may be provided from the memory controller 1200 using a command, an address, data, asserting specific input/output pin(s), etc. The control logic 1440 controls the voltage generator 1430 to change a read voltage to be provided to a read requested memory area, for example. As illustrated in FIG. 3, the read voltage may be changed, for example, between a read voltage VR1 corresponding to a threshold voltage distribution 21 formed immediately after a program operation is completed and a read voltage VR2 corresponding to a threshold voltage distribution 22 formed after the stabilization time t1 elapses. Alternatively, the control logic 1440 may control the page buffer circuit 1450 to change at least one of sensing conditions such as a bit line develop time, a bit line pre-charge time, a sensing margin (e.g., a relationship between a bit line pre-charge voltage and a bit line shut-off voltage), and so on. A change in sensing condition may be viewed as a variation in read condition. The read conditions are not limited to this disclosure.

Figure 8A:
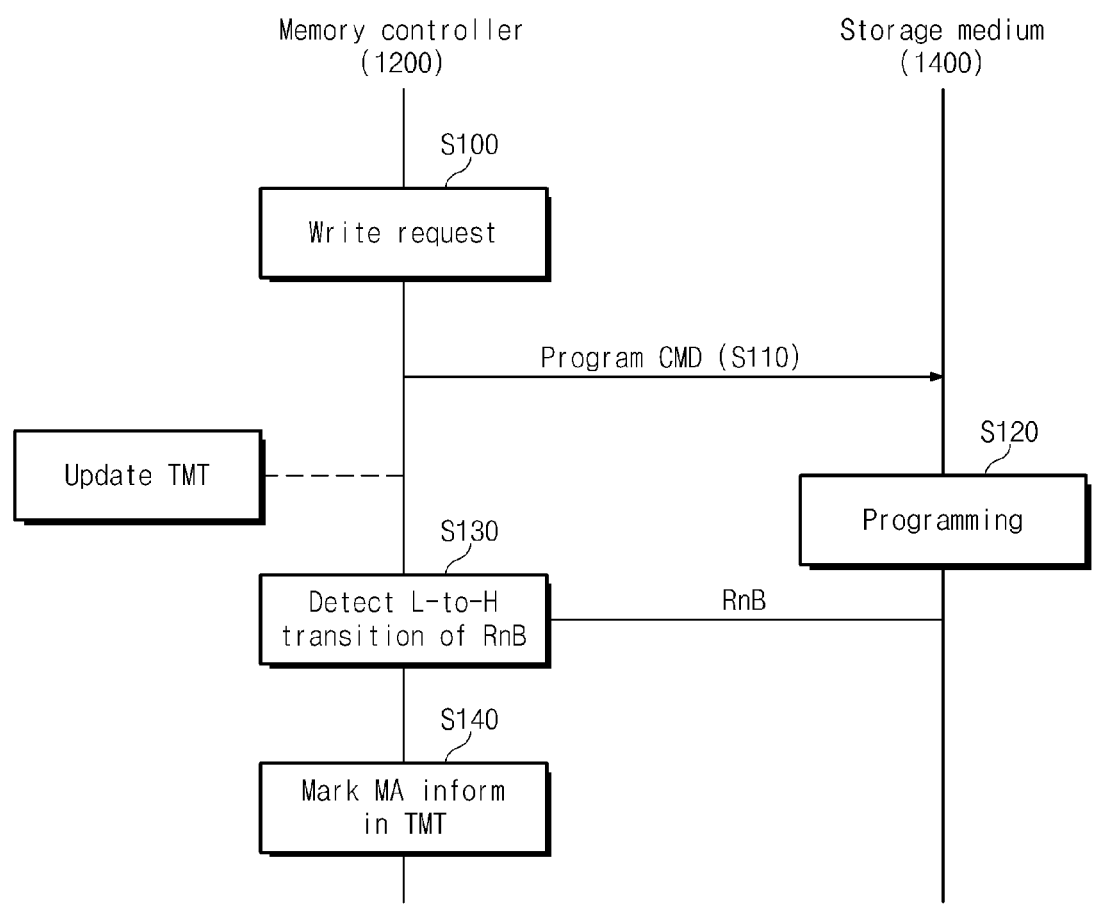
FIG. 8A is a diagram schematically illustrating a write flow of a memory system according to an embodiment of the inventive concepts.

FIG. 8A is a diagram schematically illustrating a write flow of a memory system according to an embodiment of the inventive concepts.

Referring to FIG. 8A, in step S100, a memory controller 1200 receives a write request from an external device (e.g., a host to which a memory system 1000 is connected). In step S110, the memory controller 1200 issues a program command to storage medium 1400. Here, the program command may be transferred to the storage medium 1400 together with an address for appointing a write requested memory area and write requested data. In step S120, the storage medium 1400 stores write requested data in the write requested memory area. After a program operation commences, in step S130, the memory controller 1200 monitors whether the program operation of the storage medium 1400 is ended. Here, whether the program operation of the storage medium 1400 is ended may be determined by detecting a transition (e.g., a low-to-high transition) of a signal (e.g., a signal on an RnB line) output from the storage medium 1400. If a low-to-high transition of the signal (e.g., an RnB signal) from the storage medium 1400 is detected, in step S140, the memory controller 1200 marks information of the write requested memory area in a time mark table 1242. Afterwards, a write flow may be ended.

In an example embodiment, during the write flow, the memory controller 1200 may manage the time mark table 1242 on the basis of a stabilization time t1 (refer to FIG. 2). The time mark table 1242 may be managed through a background operation. For example, as described with reference to FIG. 4, the identifier of a programmed memory area may be shifted within the time mark table 1242 according to a program lapse time. For example, an identifier of a specific memory area may be recorded in a time zone entry TZE1 immediately after the specific memory area MA1 is programmed. After a time range corresponding to a time zone TZ1 elapses, the identifier of the specific memory area may be shifted into a time zone entry TZE2. At this time, the identifier of the specific memory area in the time zone entry TZE1 may be invalidated or eliminated. After a time range corresponding to a time zone TZ2 elapses, the identifier of the specific memory area may be shifted into a time zone entry TZE3. At this time, the identifier of the specific memory area in the time zone entry TZE2 may be invalidated or eliminated. The identifier of the specific memory area may be removed from the time mark table 1242 after a time range corresponding to a time zone TZ3 elapses. Program lapse times about programmed memory areas may be managed according to this manner.

As will be appreciated, the CPU 1230 in the memory controller 1200 includes a timer for measuring the elapsed time since programming for the identifiers recorded in the time mark table 1292. The CPU 1230 may start a timer for each recorded identifier. Alternatively, the CPU 1230 may use a single timer, which starts with the earliest programmed memory area having an identifier recorded in the time mark table 1242. An offset is then recorded for each subsequently recorded identifier. The offset is the timer vale when the memory area was programmed. In this manner, the CPU 1230 may determine the elapsed time by subtracting the offset from the current timer value. It will be appreciated that even the earliest recorded identifier may be managed in this fashion.

Figure 8B:
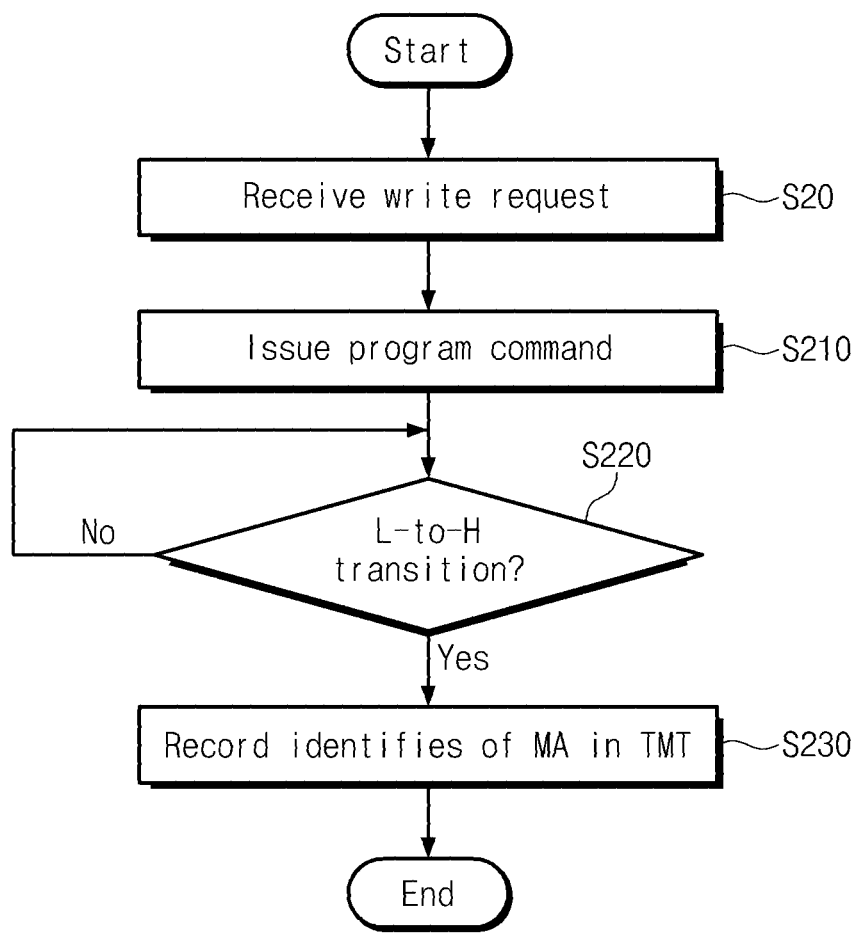
FIG. 8B is a flow chart schematically illustrating a program control method of a memory controller according to an embodiment of the inventive concepts.

FIG. 8B is a flow chart schematically illustrating a program control method of a memory controller according to an embodiment of the inventive concepts.

Referring to FIG. 8B, a program control method of a memory controller 1200 according to an embodiment of the inventive concepts includes issuing a program command (S210) after receiving a write request (S200); detecting whether a signal line (e.g., RnB) of storage medium 1400 transitions from a low level to a high level (S220) indicating completion of the program or write operation; and recording identifier of a write requested memory area in a time mark table 1242 when the signal line (e.g., RnB) of the storage medium 1400 transitions from a low level to a high level (S230). Here, when the signal line (e.g., RnB) of the storage medium 1400 does not transition from a low level to a high level, the memory controller 1200 performs an operation corresponding to step S220. The program command may be transmitted together with an address and write requested data.

Instead of recording the identifier in the time mark table 1242 at the completion of the program operation, the recording may be performed in parallel with the program operation. Namely, the recording takes place in response to (after or in parallel with) the program operation.

Figure 8C:
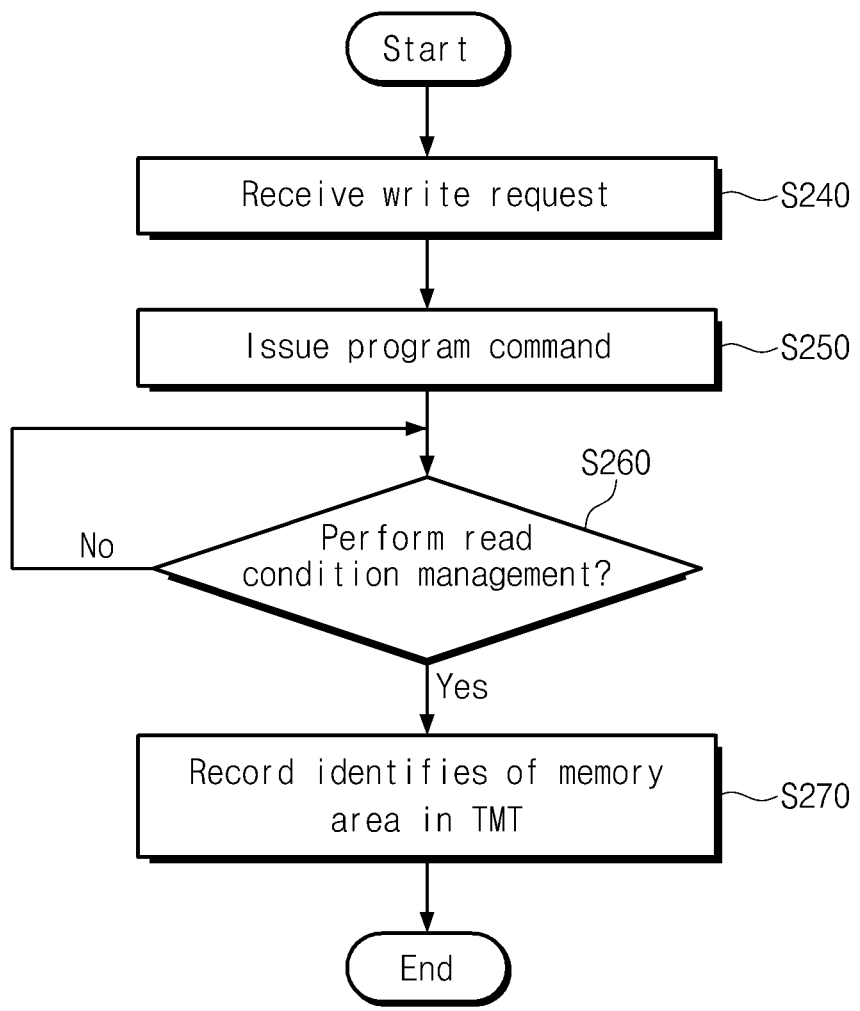
FIG. 8C illustrates a flow chart schematically illustrating a program control method of a memory controller according to an embodiment of the inventive concepts.

FIG. 8C illustrates a flow chart of method of recording information in the time mark table (TMT), according to another embodiment. As shown, the memory controller may issue a program command (S250) after receiving a write request (S240). The memory controller may then determined if a memory cell condition of the memory area qualifies the memory area for read condition management (S260). If so, the memory controller records the identifier of the write requested memory area in the TMT (S270). Otherwise, no recording is performed.

The memory controller may determine the memory area qualifies for the read condition management based on a location of a word line associated with memory area. For example, if the word line is located towards an edge of the memory area (e.g., one of the first or one of the last word lines in the memory area), then the memory controller determines the memory area qualifies for read condition management. The memory controller may determine the memory area qualifies for the read condition management based on program and erase cycle (P/E) count associated with memory area. For example, if the P/E count exceeds a threshold, the memory controller may determine the memory area qualifies for read condition management. The memory controller determines the memory area qualifies for the read condition management based on a location of memory area within the memory. For example, if the memory area is located at the edge of the memory array, then the memory controller determines the memory area qualifies for read condition management. The memory controller may determine the memory area qualifies for the read condition management based on a width of threshold voltage distribution of memory cells in the memory area. For example, if the width of the threshold voltage distribution is greater than a threshold amount, the memory controller determines the memory area qualifies for read condition management. The memory controller may determine the memory area qualifies for the read condition management based on a type of memory cells in the memory area. For example, the memory controller determines that the memory area qualifies for the read condition management if the type of memory cell in the memory is multi-level, and determines the memory area does not qualify for the read condition management if the type of memory cells in the memory is single-level.

In an example embodiment, during a background operation, the memory controller 1200 may manage the time mark table 1242 based on a. For example, as described with reference to FIG. 4, the identifier of a programmed memory area may be shifted within the time mark table 1242 according to a program lapse time.

FIG. 9 illustrates an example of the time mark table (TMT) changing over time. In the example of FIG. 9, it is assumed that memory areas having identifiers (e.g., addresses) D0, D1, D2 and D3 are programmed at times 0 sec, 1.2 sec, 1.4 sec, 3 sec. Furthermore, FIG. 9 illustrates the TMT at times t1=0 sec, $ts_1$=1.2 sec, $ts_2$=1.4 sec, $ts_3$=3 sec. and $ts_4$=5 sec. For ease of understanding, the TMT is shown as including four time zones Z0, Z1, Z2 and Z3. However, it will be understood that more than four time zone or less than four times zones may exist. Furthermore, the time zone Z0 represents the elapsed time range of 0 to 0.99 sec, the time zone Z1 represents the elapsed time range of 1 to 1.99 sec, the time zone Z2 represents the elapsed time range of 2 to 2.99 see, and the time zone Z3 represents the elapsed time range of 3 to 3.99 s.

As shown in FIG. 9, at time $ts_0$=0 sec, the memory controller stores the identifier D0 in the first time zone Z0 of the TMT. At time $ts_1$=1.2, the memory controller has moved the identifier D0 from the first time zone Z0 to the second time zone Z1, and has stored the identifier D1 in the first time zone Z0. At time $ts_2$=1.4 sec, the memory controller stores the identifier D2 in the first time zone Z0, but none of the previously stores identifiers have been moved. Accordingly, both identifier D1 and D2 are associated with the first time zone Z0. At time $ts_3$=3.0 sec. the memory controller has moved the identifier D0 to the fourth time zone Z3, has moved the identifiers D1 and D2 to the second time zone Z1, and has stored the identifier D3 in the first time zone Z0. At time $ts_4$=5 sec, the memory controller has removed the identifier D0 from the TMT, has moved the identifier D1 to the fourth time zone Z3, has moved the identifier D2 to the third time zone Z2, and has moved the identifier D1 to the second time zone Z1.

Figure 10:
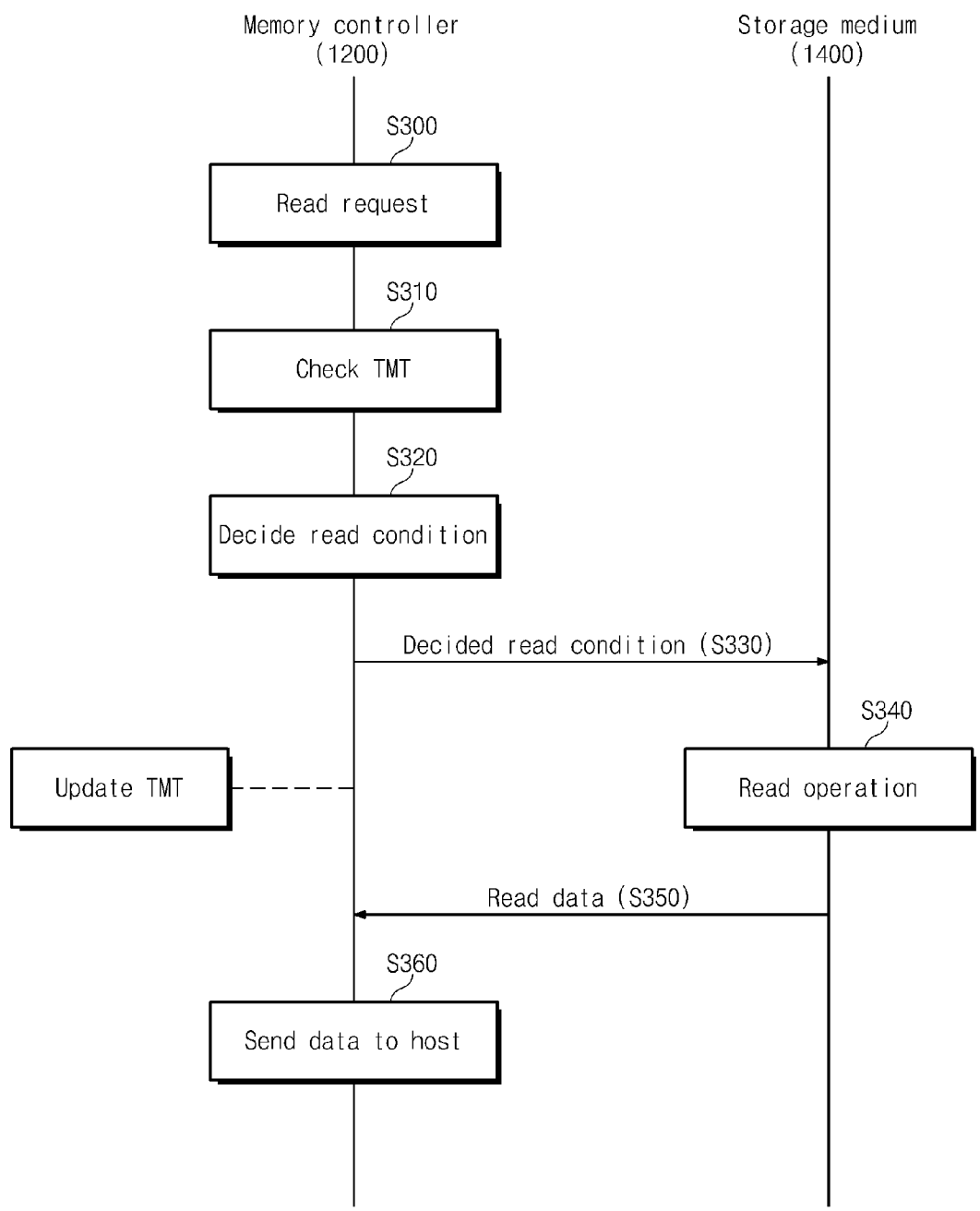
FIG. 10 is a diagram schematically illustrating a read flow of a memory system according to an embodiment of the inventive concepts.

FIG. 10 is a diagram schematically illustrating a read flow of a memory system according to an embodiment of the inventive concepts.

Referring to FIG. 10, in step S300, a memory controller 1200 receives a read request from an external device (e.g., a host to which a memory system 1000 is connected). In step S310, the memory controller 1200 determines whether or not a time mark table 1242 includes the identifier of a read requested memory area. In step S320, the memory controller 1200 decides a read condition based on the decision result. That is, there may be selected read condition information corresponding to a time zone entry TZEi to which the identifier of the read requested memory area belongs. In step S330, the memory controller 1200 provides storage medium 1400 with the read condition information thus decided. The read condition information may be transmitted to the storage medium 1400 using a command, an address, data, or a specific input/output pin(s). In step S340, the storage medium 1400 performs a read operation about a read requested memory area according to the read condition information provided from the memory controller 1200. In step S350, the read data is transferred to the memory controller 1200. In step S360, the memory controller 1200 provides the read data to the external device.

In an example embodiment, during the read flow, the memory controller 1200 may manage the time mark table 1242. The time mark table 1242 may be managed through a background operation. For example, as described with reference to FIG. 4, the identifier of a programmed memory area may be shifted within the time mark table 1242 according to a program lapse time. For example, the identifier of a specific memory area may be recorded in a time zone entry TZE1 immediately after the specific memory area MA1 is programmed. After a time range corresponding to a time zone TZ1 elapses, the identifier of the specific memory area may be shifted into a time zone entry TZE2. At this time, the identifier of the specific memory area in the time zone entry TZE1 may be invalidated or eliminated. After a time range corresponding to a time zone TZ2 elapses, the identifier of the specific memory area may be shifted into a time zone entry TZE3. At this time, the identifier of the specific memory area in the time zone entry TZE2 may be invalidated or eliminated. The identifier of the specific memory area may be removed from the time mark table 1242 after a time range corresponding to a time zone TZ3 elapses.

Figure 11:
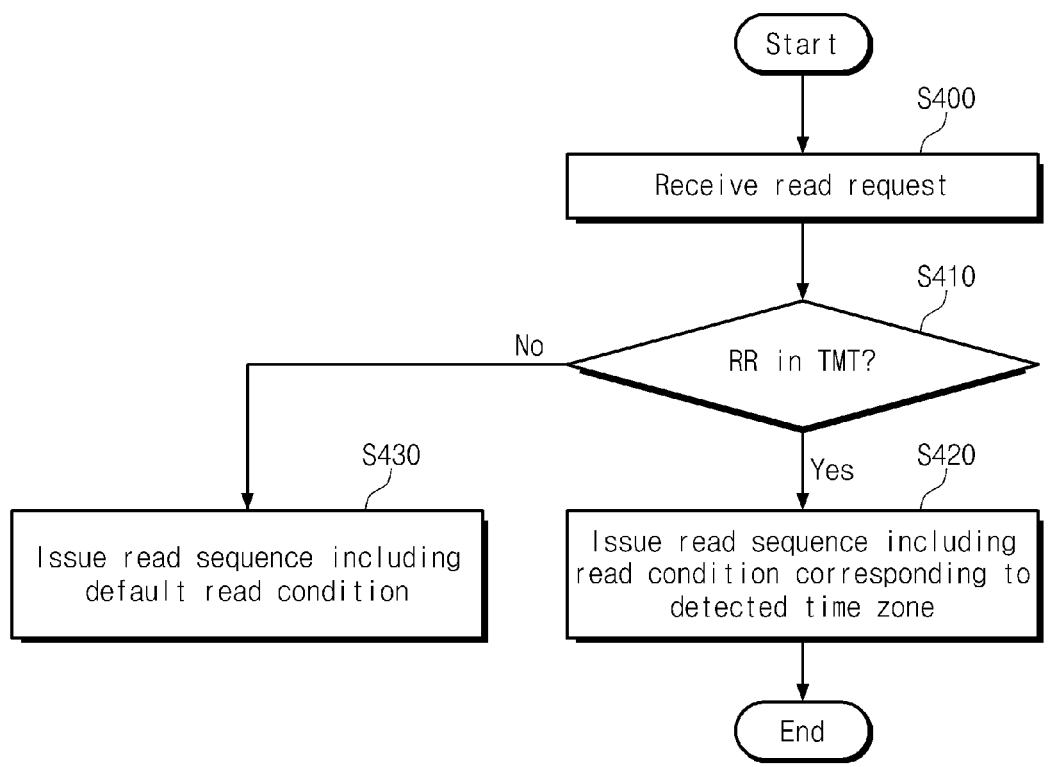
FIG. 11 is a flow chart schematically illustrating a read control method of a memory controller according to an embodiment of the inventive concepts.

FIG. 11 is a flow chart schematically illustrating a read control method of a memory controller according to an embodiment of the inventive concepts.

Referring to FIG. 11, a read control method of a memory controller according to an embodiment of the inventive concepts includes receiving a read request (S400); determining whether a time mark table 1242 includes information of a read requested memory area (S410); issuing a read sequence including the read condition information corresponding to a time zone entry TZEi to which the identifier of the read requested memory area belongs (S420); and issuing a read sequence including default read condition information when the time mark table 1242 does not include the identifier of the read requested memory area (S430). The default read condition information, for example, may be where a read voltage VR2 shown in FIG. 2 is generated. Alternatively, the read condition information may be a sensing condition that corresponds to the read voltage VR2. In this case, a read voltage VR1 may be used. Here, the sensing condition may include a bit line pre-charge voltage, a bit line develop time, a bit line shut-off voltage, one thereof, or a combination of at least two thereof. Alternatively, both the read voltage and the sensing condition may be changed.

In an example embodiment, during a background operation, the memory controller 1200 may manage the time mark table 1242. For example, as described with reference to FIG. 4, information of a programmed memory area may be shifted within the time mark table 1242 according to a program lapse time.

Figure 12:
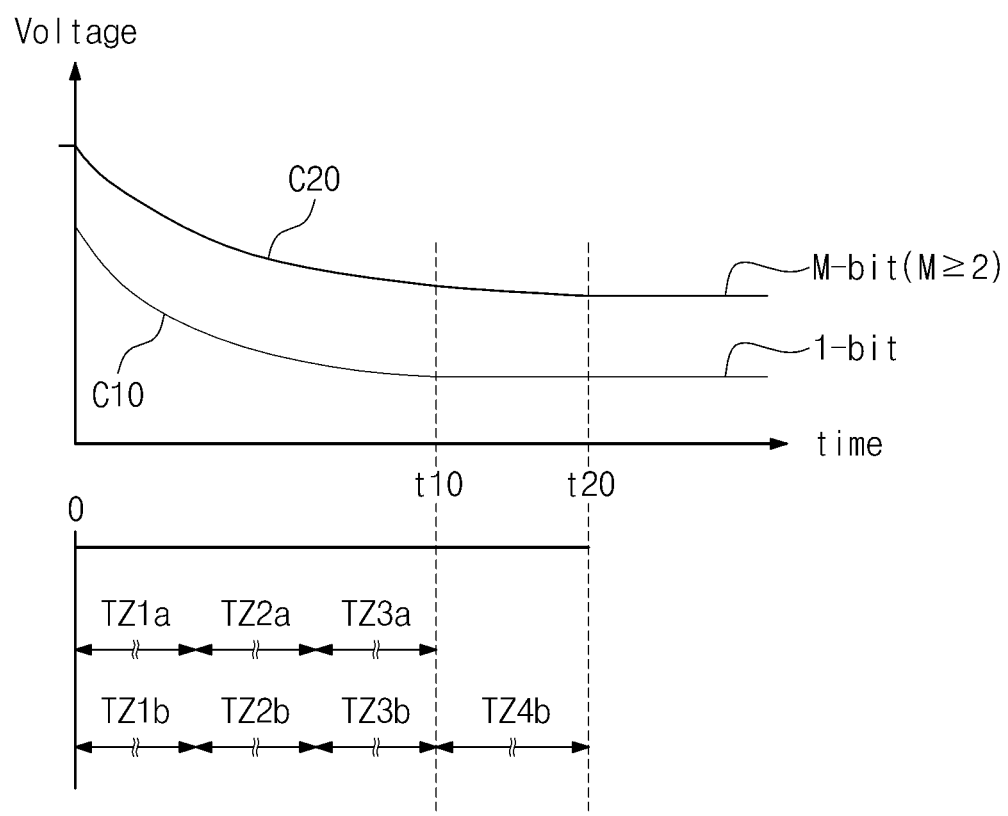
FIG. 12 is a graph showing that threshold voltages of CTF cells vary due to a fast charge loss phenomenon.

FIG. 12 is a graph showing that threshold voltages of CTF cells vary due to a fast charge loss phenomenon.

A time interval where a threshold voltage of a CTF cell is varied, that is, a time interval between a program completion time and the stablilization time may be variable, not fixed. For example, a variation in threshold voltage generated when i-bit data is stored in a CTF cell may be different from that generated when M-bit data (M being an integer of 2 or more) is stored in a CTF cell. In other words, a variation in threshold voltage generated when LSB data is stored in a CTF cell may be different from that generated when MSB data is stored in a CTF cell. Alternatively, a variation in threshold voltage generated when LSB data is stored in a CTF cell may be different from that generated when intermediate data is stored in a CTF cell and different from that generated when MSB data is stored in a CTF cell. For this reason, as illustrated in FIG. 12, different stabilization times t10 and t20 may be selected. This means that the number of time zones TZ1a. TZ2a, and TZ3a corresponding to a curve C10 may be different from the number of time zones TZ1b, TZ2b, TZ3b, and TZ4b corresponding to a curve C20. Alternatively, the number of time zones corresponding to the curve C10 may equal to the number of time zones corresponding to the curve C20, and the times of the time zones corresponding to the curve C10 are different from times of time zones corresponding to the curve C20. A variation in threshold voltage generated when N-bit data (N being an integer of 1 or more) is stored in a CTF cell may be variable according to the number of data bits stored in a CTF cell and endurance of a CTF cell. Thus, the stabilization time and time zones according to the inventive concepts may be variably decided according to one or more factors. For example, the memory controller may selectively change a number of entries or time zones in the TMT based on at least one of a location of word line associated with memory area, a program and erase cycle count associated with memory area, a location of the memory area within the memory, a type of memory cell in the memory area, and an expected width of threshold voltage distribution of memory cells in the memory area. As another example, the memory controller may selectively changing the range of elapsed time associated with at least one entry or time zone of the TMT based on at least one of a location of word line associated with memory area, a program and erase cycle count associated with memory area, a location of the memory area within the memory, a type of memory cell in the memory area, and an expected width of threshold voltage distribution of memory cells in the memory area.

In an exemplary embodiment, a sum of times corresponding to time zones TZ1a, TZ2a, and TZ3a corresponding to the curve C10 may correspond to the stabilization time t10. A sum of times corresponding to time zones TZ1b, TZ2b, TZ3b, and TZ4b corresponding to the curve C20 may correspond to the stabilization time t20. Times respectively corresponding to time zones may be different from or equal to one another. Alternatively, assuming that the times respectively corresponding to time zones are divided into a first group and a second group, times belonging to the first group may be different from or equal to one another, and times belonging to the second group and may be different from or equal to one another. Also, times belonging to the first group may be different from times belonging to the first group. However, times respectively corresponding to time zones are not limited to this disclosure.

In an example embodiment, read conditions respectively allocated to time zones may be different from one another. A default read condition may be used after the stabilization time elapses.

Figure 13:
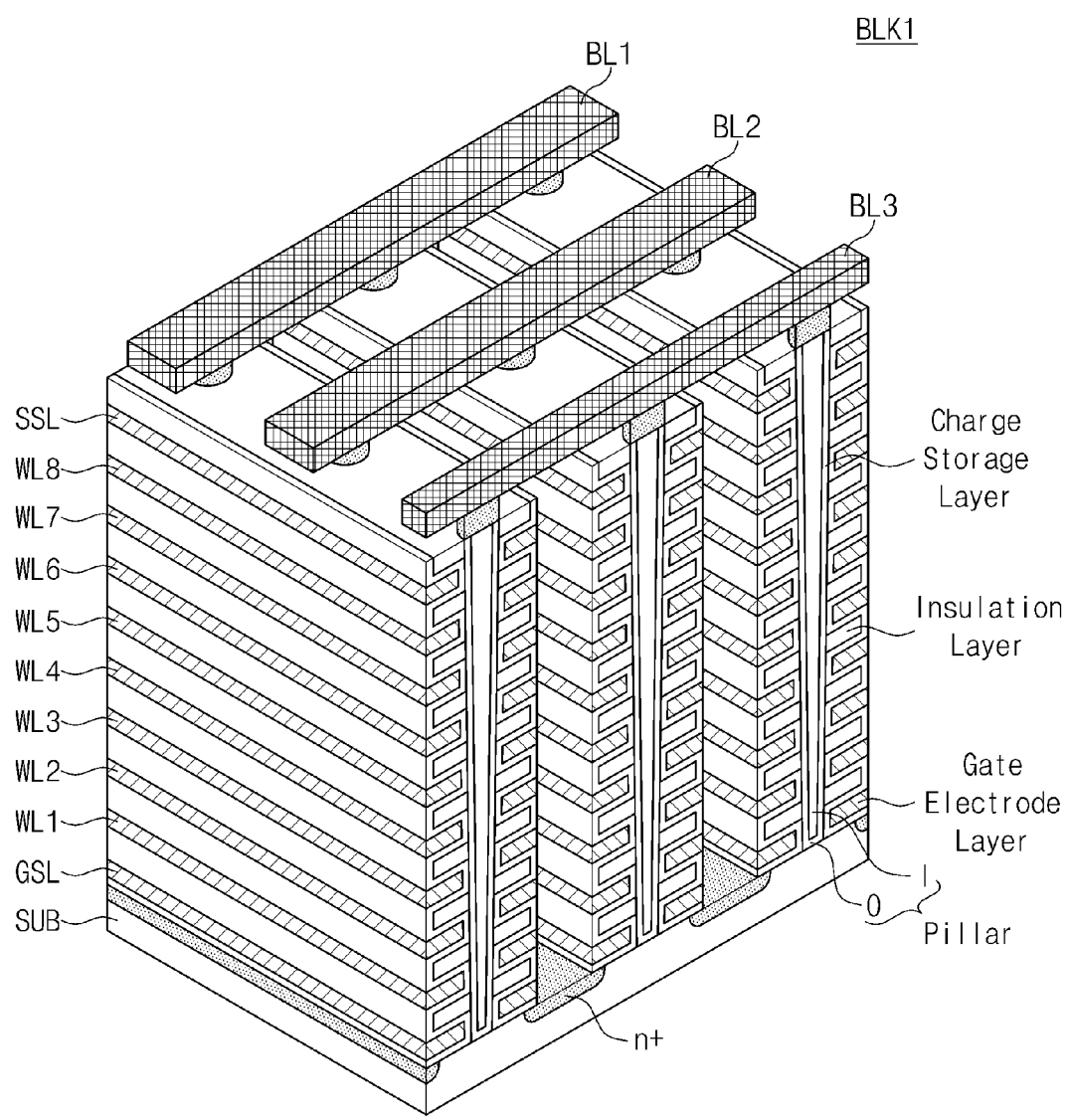
FIG. 13 is a perspective view schematically illustrating a three-dimensional structure of a memory block according to an embodiment of the inventive concepts.

FIG. 13 is a perspective view schematically illustrating a three-dimensional structure of a memory block according to an embodiment of the inventive concept and to which the above described embodiments may be applied. Referring to FIG. 13, a memory block BLK1 is formed in a direction perpendicular to a substrate SUB. An n+ doping region is formed in the substrate SUB. A gate electrode layer and an insulation layer are deposited on the substrate SUB in turn. A charge storage layer is formed between the gate electrode layer and the insulation layer.

If the gate electrode layer and the insulation layer are patterned in a vertical direction, a V-shaped pillar may be formed. The pillar may be connected with the substrate SUB via the gate electrode layer and the insulation layer. An outer portion O of the pillar may be formed of a channel semiconductor, and an inner portion I thereof may be formed of an insulation material such as silicon oxide.

The gate electrode layers of the memory block BLK1 are connected to a ground selection line GSL, a plurality of word lines WL1 to WL8, and a string selection line SSL. The pillars of the memory block BLK1 may be connected to a plurality of bit lines BL1 to BL3. In FIG. 13, there is illustrated an example where one memory block BLK1 has two selection lines SSL and GSL, eight word lines WL1 to WL8, and three bit lines BL1 to BL3. However, the inventive concepts are not limited thereto.

Figure 14:
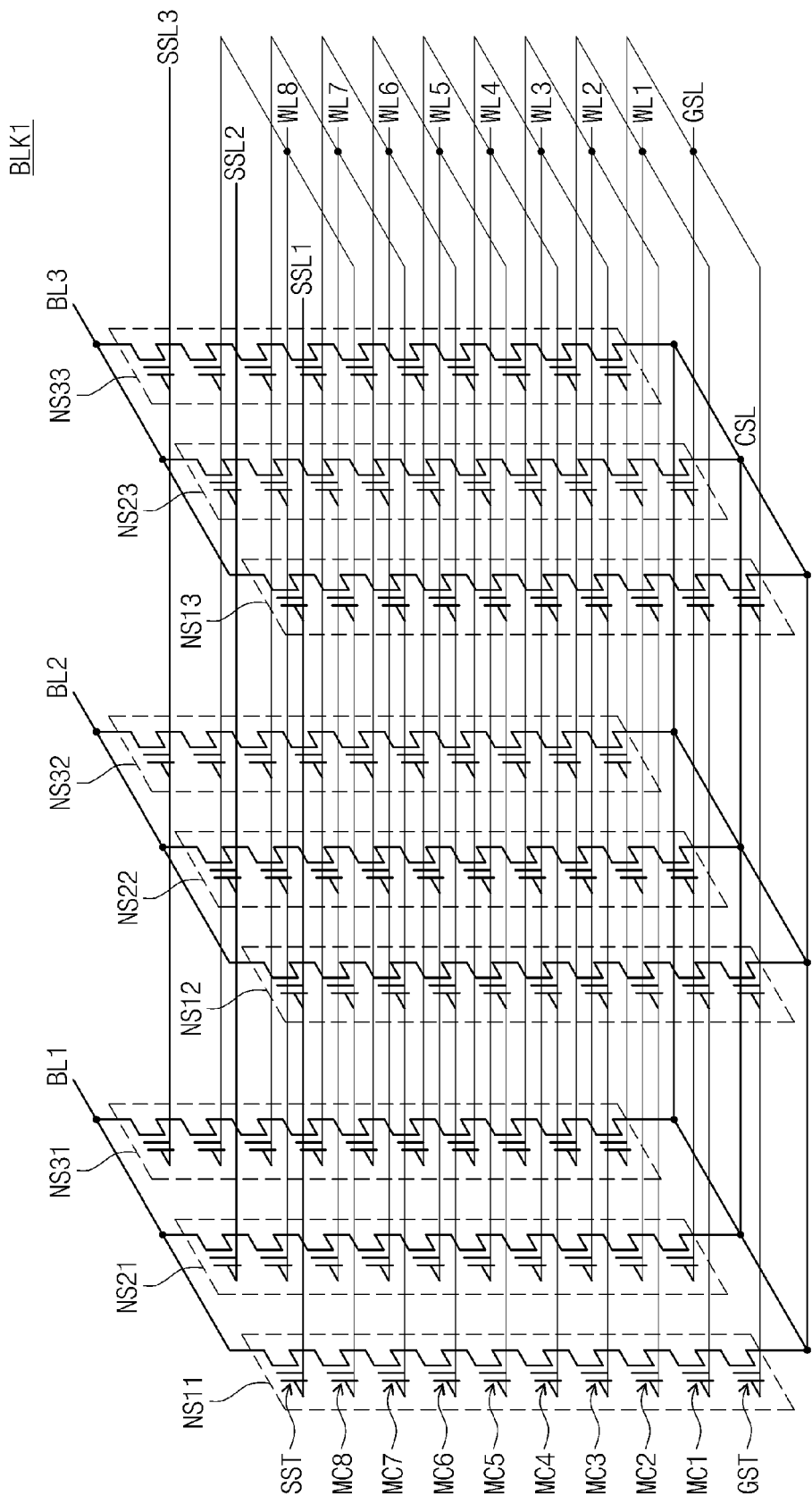
FIG. 14 is a circuit diagram schematically illustrating an equivalent circuit of a memory block illustrated in FIG. 13.

FIG. 14 is a circuit diagram schematically illustrating an equivalent circuit of a memory block illustrated in FIG. 13. Referring to FIG. 14, NAND strings NS11 to NS33 may be connected between respective bit lines BL1 to BL3 and a common source line CSL. Each NAND string (e.g., NS11) includes a string selection transistor SST, a plurality of memory cells MC1 to MC8, and a ground selection transistor GST.

The string selection transistors SST are connected to respective string selection lines SSL1 to SSL3. The memory cells MC1 to MC8 are connected to respective corresponding word lines WL1 to WL8, respectively. The ground selection transistors GST are connected to ground selection lines GSL1 to GSL3. In each NAND string, the string selection transistor SST may be connected to a bit line, and the ground selection transistor GST may be connected to the common source line CSL.

Word lines (e.g., WL1) at the same height may be connected in common, and the string selection lines SSL1 to SSL3 may be separated from one another. The string selection lines GSL1 to GSL3 may be connected in common. At programming of memory cells (constituting a page) connected with a first word line WL1 and included in NAND strings NS11, NS12, and NS13, there may be selected a first word line WL1 and a first string selection line SSL1.

Figure 15:
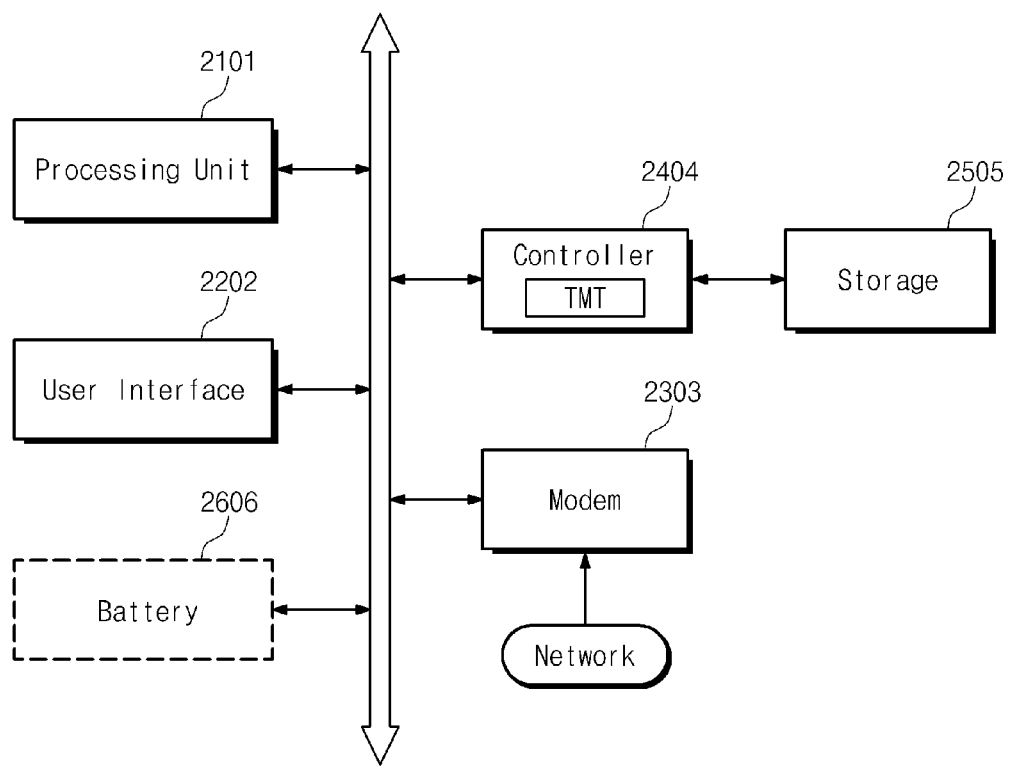
FIG. 15 is a block diagram schematically illustrating a computing system according to an embodiment of the inventive concepts.

FIG. 15 is a block diagram schematically illustrating a computing system according to an embodiment of the inventive concepts. A computing system may include a processing unit 2101, a user interface 2202, a modem 2303 such as a baseband chipset, a memory controller 2404, and storage medium 2505.

The memory controller 2404 may be configured the same or substantially the same as illustrated in FIG. 6, and the storage medium 2505 may be formed of a nonvolatile memory device as illustrated in FIG. 7. For example, the memory controller 2404 stores a program completion time of a program requested memory area in a time mark table TMT at a program operation, and the memory controller 2404 determines whether information of a read requested memory area is stored in the time mark table TMT, at a read operation. When information of the read requested memory area is stored in the time mark table TMT, the memory controller 2404 controls the storage medium 2505 to perform a read operation according to a read condition corresponding to a time zone of the time mark table TMT to which the read requested memory area belongs. Thus, it is possible to reduce or prevent read fail due to the fast charge loss phenomenon.

N-bit data (N being I or more integer) processed/to be processed by the processing unit 2101 may be stored in the storage medium 2505 through the memory controller 2404. In the event that the computing system is a mobile device, a battery 2606 may be further included in the computing system to supply an operating voltage thereto. Although not illustrated in FIG. 15, the computing system may further comprise an application chipset, a camera image processor (CIS), a mobile DRAM, and the like.

Figure 16:
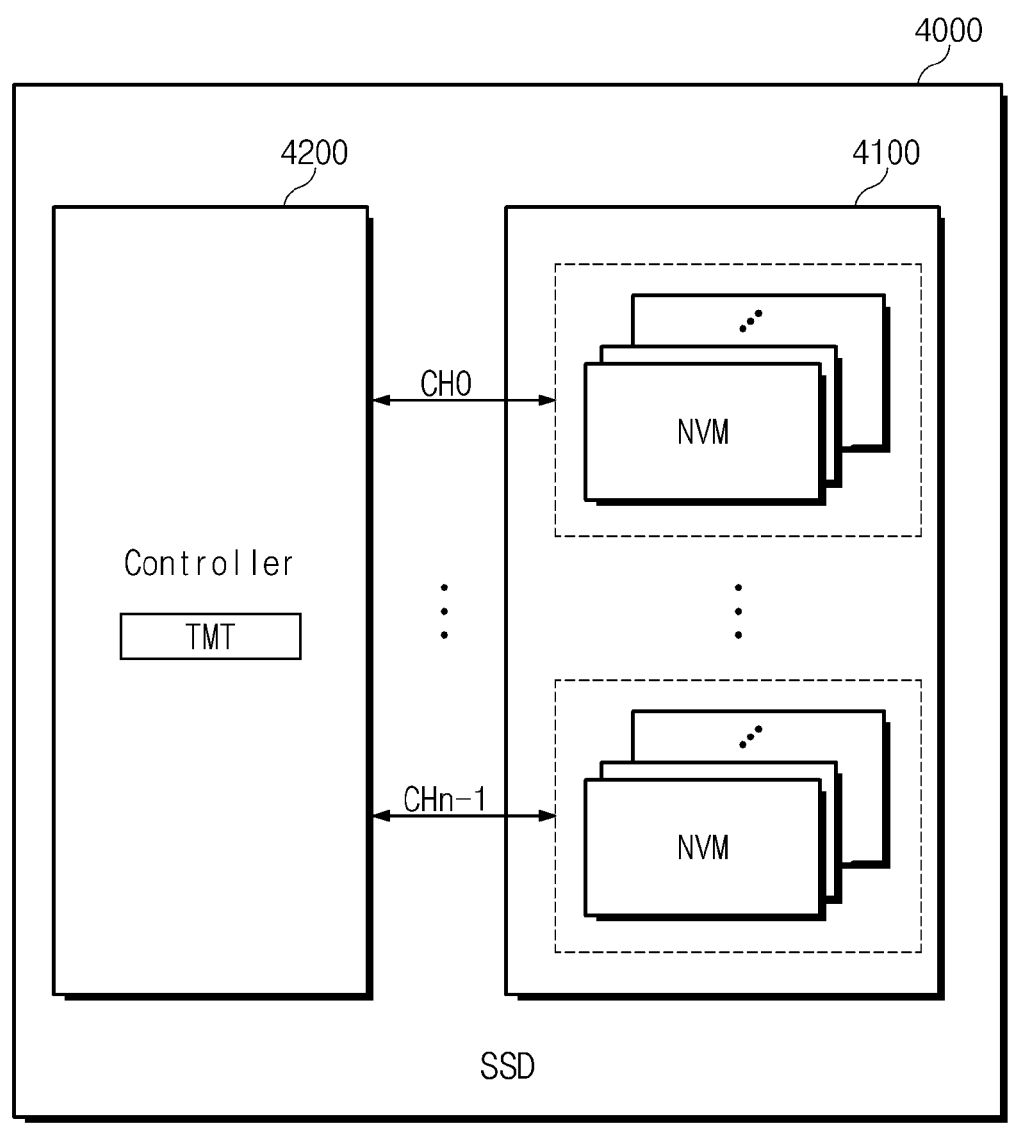
FIG. 16 is a block diagram schematically illustrating a solid state drive according to an embodiment of the inventive concepts.

FIG. 16 is a block diagram schematically illustrating a solid state drive according to an embodiment of the inventive concepts.

Referring to FIG. 16, a solid state drive (SSD) 4000 includes storage medium 4100 and a controller 4200. The storage medium 4100 may be connected to the controller 4200 via a plurality of channels, each of which is connected with a plurality of nonvolatile memories in common.

The controller 4200 is configured the same or substantially the same as illustrated in FIG. 6, and each of nonvolatile memory devices in storage medium 4100 is formed of a nonvolatile memory device as illustrated in FIG. 7. For example, the controller 4200 stores a program completion time of a program requested memory area in a time mark table TMT at a program operation, and the controller 4200 determines whether information of a read requested memory area is stored in the time mark table TMT, at a read operation. When information of the read requested memory area is stored in the time mark table TMT, the controller 4200 controls the storage medium 4100 to perform a read operation according to a read condition corresponding to a time zone of the time mark table TMT to which the read requested memory area belongs. Thus, it is possible to reduce or prevent read fail due to the fast charge loss phenomenon.

Figure 17:
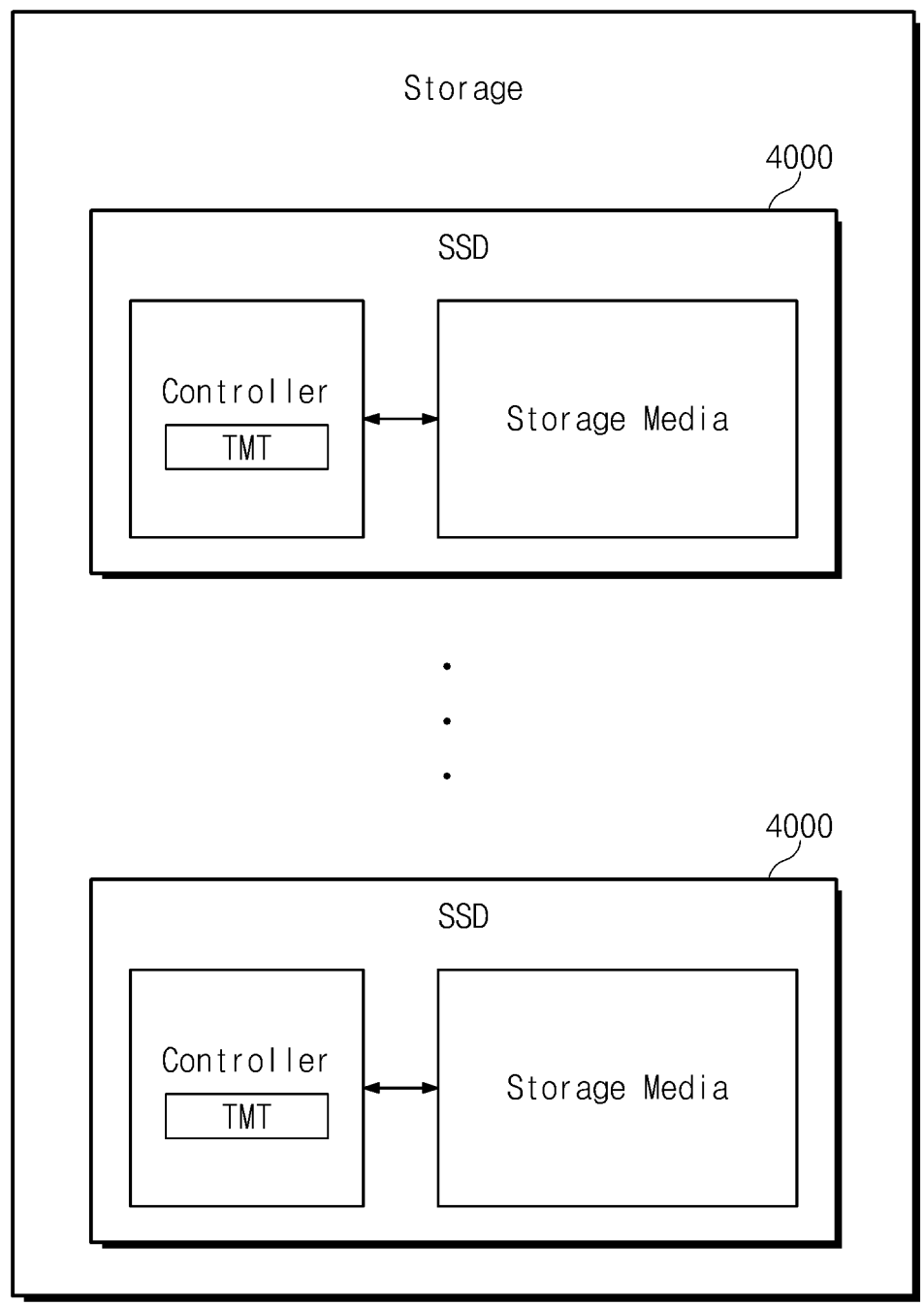
FIG. 17 is a block diagram schematically illustrating a storage using a solid state drive in FIG. 16.
Figure 18:
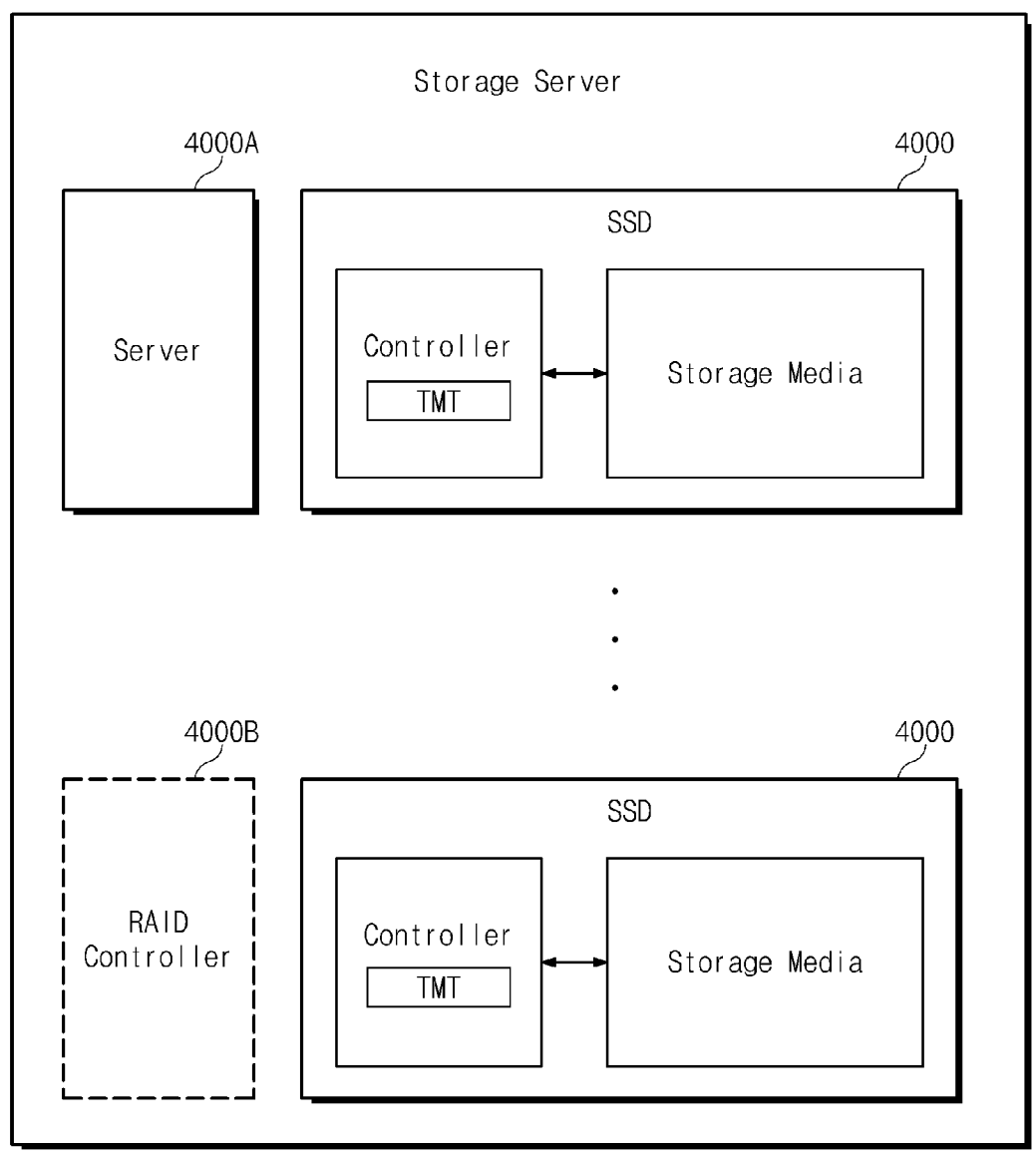
FIG. 18 is a block diagram schematically illustrating a storage server using a solid state drive in FIG. 16.

FIG. 17 is a block diagram schematically illustrating a storage using a solid state drive in FIG. 16, and FIG. 18 is a block diagram schematically illustrating a storage server using a solid state drive in FIG. 16.

An SSD 4000 according to an embodiment of the inventive concepts may be used to form storage. As illustrated in FIG. 17, the storage may include a plurality of solid state drives 4000, which are configured the same as described in FIG. 16. An SSD 4000 according to an embodiment of the inventive concepts may be used to configure a storage sever. As illustrated in FIG. 18, a storage server includes a plurality of solid state drives 4000, which are configured the same as described in FIG. 16, and a server 4000A. Further, it is well comprehended that a well-known RAID controller 4000B is provided in the storage server.

Figure 19:
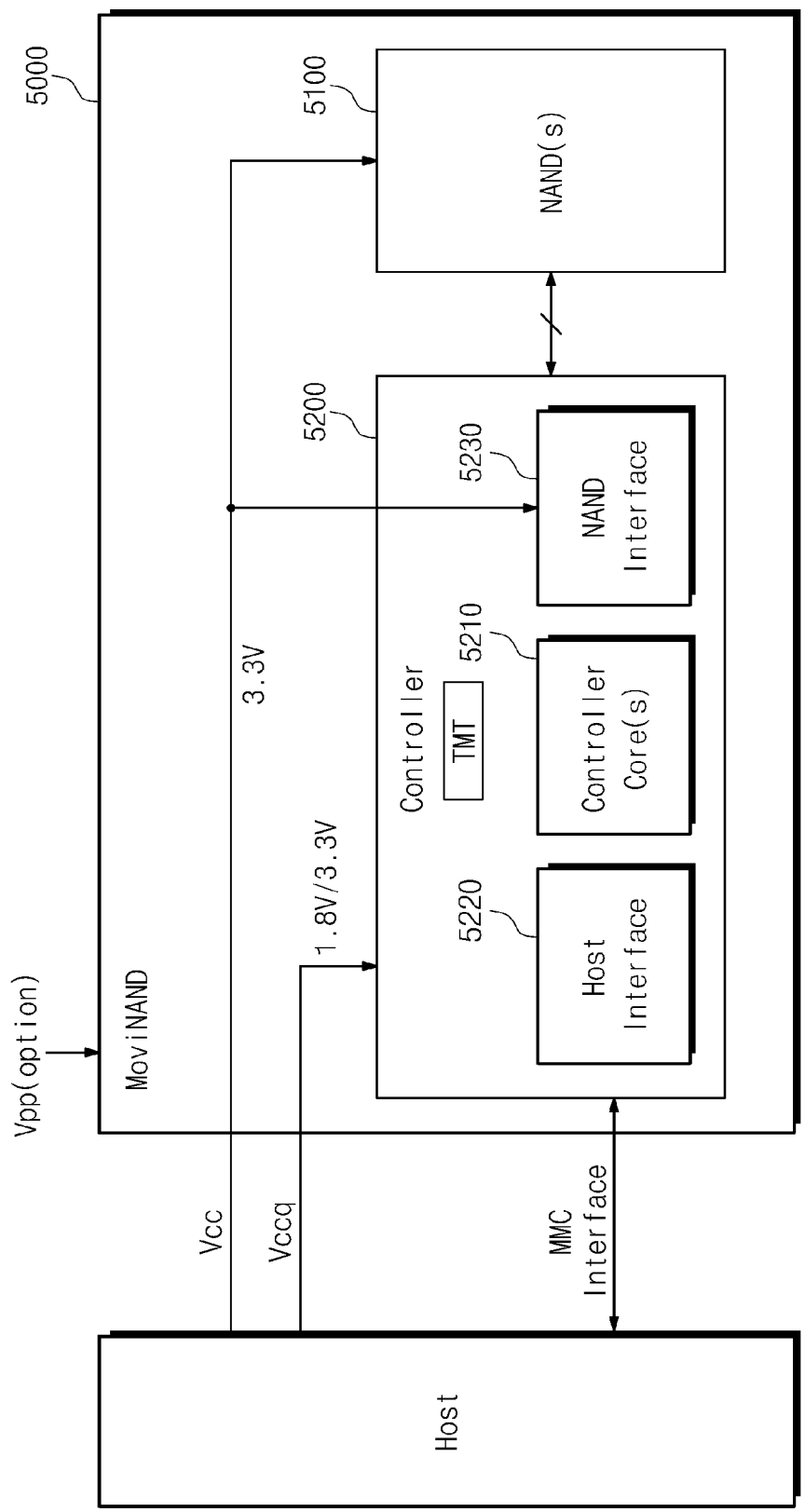
FIG. 19 is a block diagram schematically illustrating embedded storage according to an embodiment of the inventive concepts.

FIG. 19 is a block diagram schematically illustrating embedded storage according to an embodiment of the inventive concepts. Referring to FIG. 19, embedded storage 5000 may include at least one NAND flash memory device 5100 and a controller 5200. The embedded storage 5000 may support the MMC 4.4 (or, referred to as "eMMC") standard.

The NAND flash memory device 5100 may be a single data rate (SDR) NAND flash memory device or a double data rate (DDR) NAND flash memory device. In example embodiments, the NAND flash memory device 5100 may include NAND flash memory chips. Herein, the NAND flash memory device 5100 may be implemented by stacking the NAND flash memory chips in one package (e.g., FBGA, Fine-pitch Ball Grid Array, etc.).

The controller 5200 may be configured the same or substantially the same as illustrated in FIG. 6, and the NAND flash memory device 5100 may be formed of a nonvolatile memory device as illustrated in FIG. 7. For example, the controller 5200 stores a program completion time of a program requested memory area in a time mark table TMT at a program operation, and the controller 5200 determines whether information of a read requested memory area is stored in the time mark table TMT, at a read operation. When information of the read requested memory area is stored in the time mark table TMT, the controller 5200 controls the NAND flash memory device 5100 to perform a read operation according to a read condition corresponding to a time zone of the time mark table TMT to which the read requested memory area belongs. Thus, it is possible to reduce or prevent read fail due to the fast charge loss phenomenon.

The controller 5200 is connected to the NAND flash memory device 5100 via a plurality of channels. The controller 5200 includes at least one controller core 5210, a host interface 5220, and a NAND interface 5230. The controller core 5210 controls an overall operation of the embedded storage 5000. The host interface 5220 is configured to perform an MMC interface between the controller 5200 and a host. The NAND interface 5230 is configured to interface between the NAND flash memory device 5100 and the controller 5200. In example embodiments, the host interface 5220 may be a parallel interface (e.g., an MMC interface). In other example embodiments, the host interface 5220 of the embedded storage 5000 may be a serial interface (e.g., UHS-II, UFS, etc.).

The embedded storage 5000 may receive power supply voltages Vcc and Vccq from the host. Herein, the power supply voltage Vcc (about 3.3V) may be supplied to the NAND flash memory device 5100 and the NAND interface 5230, while the power supply voltage Vccq (about 1.8V/3.3V) may be supplied to the controller 5200. In example embodiments, an external high voltage Vpp may be optionally supplied to the embedded storage 5000.

The embedded storage 5000 according to an embodiments of the inventive concept may be advantageous to store mass data as well as may have an improved read characteristic. The embedded storage 5000 according to an embodiment of the inventive concept is applicable to small and low-power mobile products (e.g., a Galaxy S, iPhone, etc.).

Figure 20:
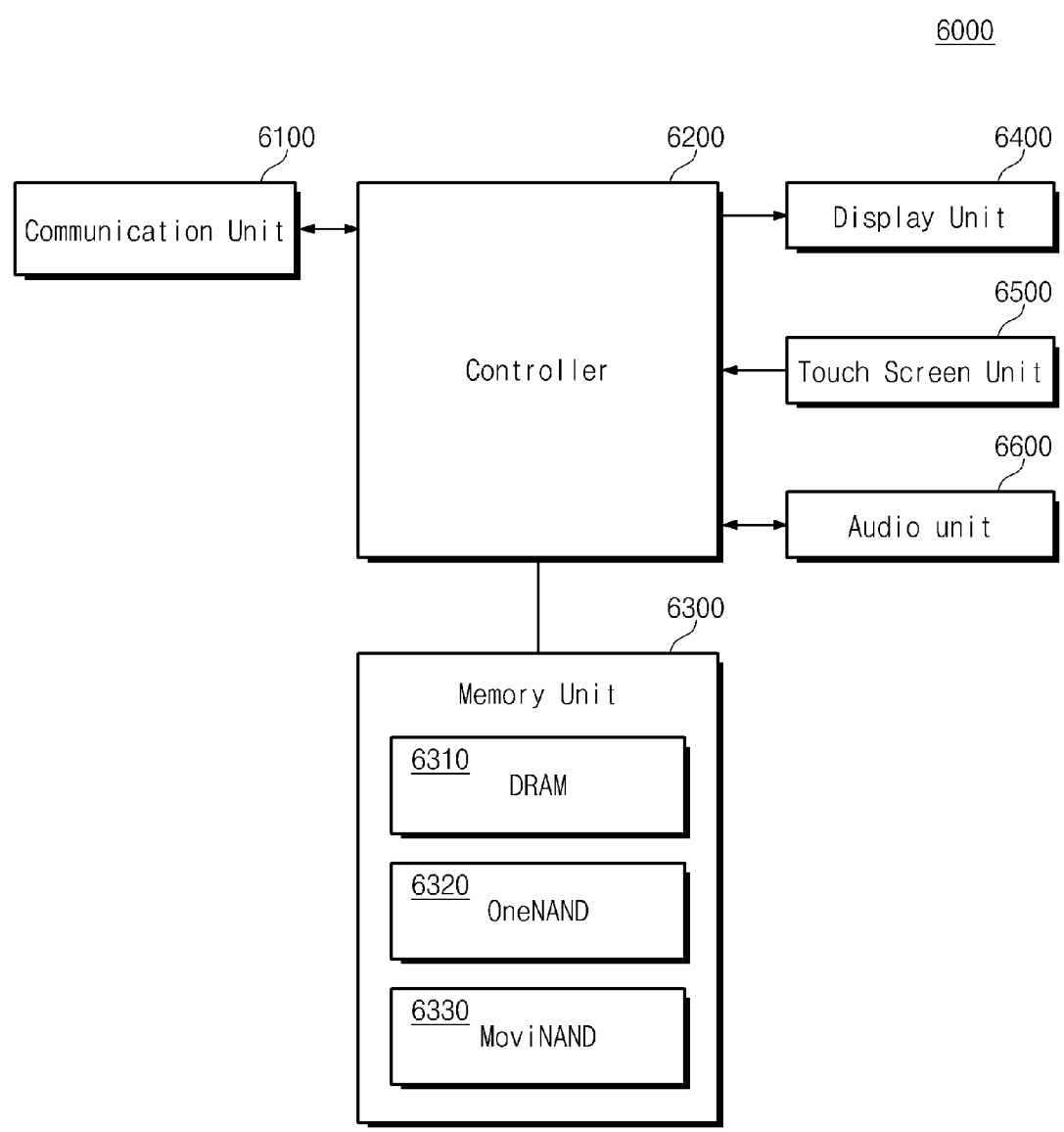
FIG. 20 is a block diagram schematically illustrating a communication device according to an embodiment of the inventive concepts.

FIG. 20 is a block diagram schematically illustrating a communication device according to an embodiment of the inventive concepts. Referring to FIG. 20, a communication device 6000 includes a communication unit 6100, a controller 6200, a memory unit 6300, a display unit 6400, a touch screen unit 6500, and an audio unit 6600. The memory unit 6300 includes at least one DRAM 6310, at least one OneNAND® 6320, and at least one moviNAND® (or, embedded storage) 6330.

The controller 6200 may be configured the same or substantially the same as illustrated in FIG. 6.

A detailed description of the mobile device is disclosed in U.S. Patent Publication Nos. 2010/0010040, 2010/0062715, 2010/0309237 and 2010/0315325, the entire contents of each of which are herein incorporated by reference.

Figure 21:
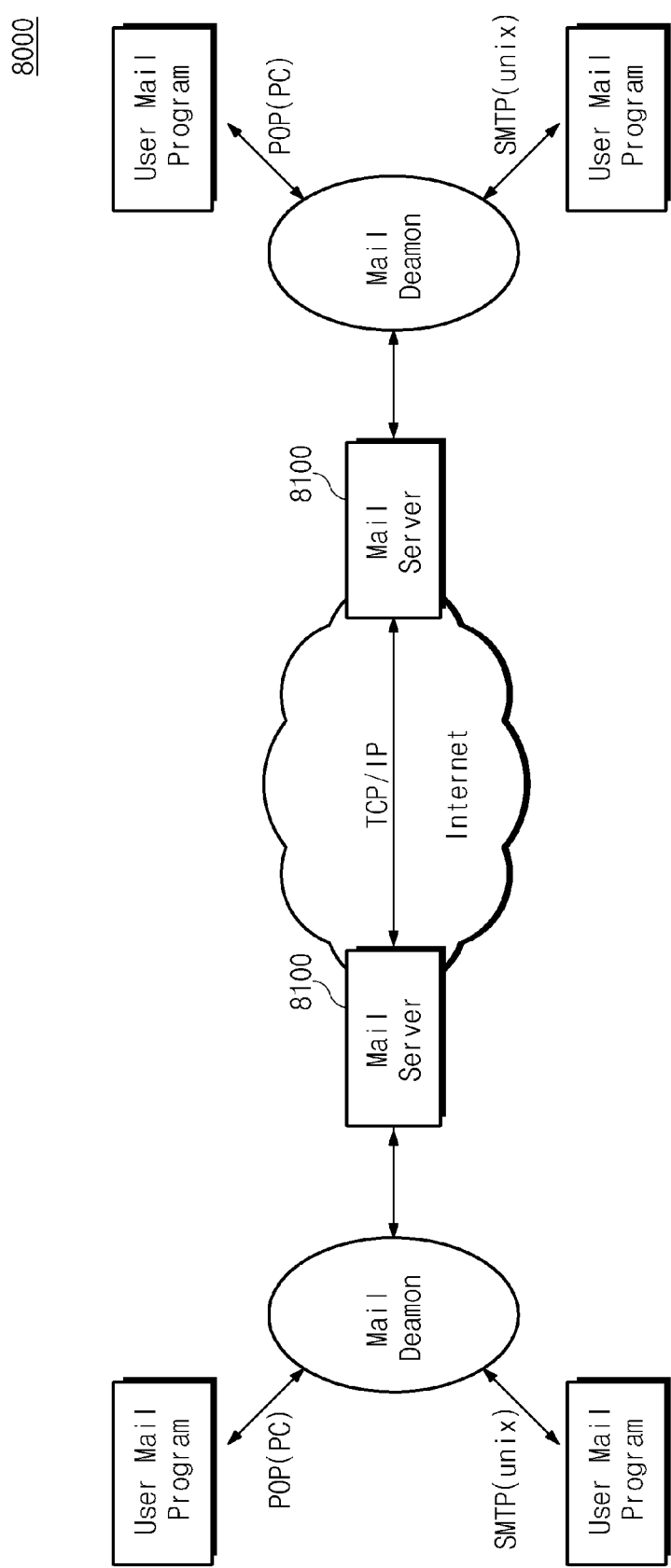
FIG. 21 is a diagram schematically illustrating a system to which a solid state drive device according to an embodiment of the inventive concepts is applied.

FIG. 21 is a diagram schematically illustrating a system to which a solid state drive device according to an embodiment of the inventive concepts is applied.

As illustrated in FIG. 21, a solid state drive including a data storage device according to an embodiment of the inventive concepts may be applied to a main server 8100.

Figure 22:
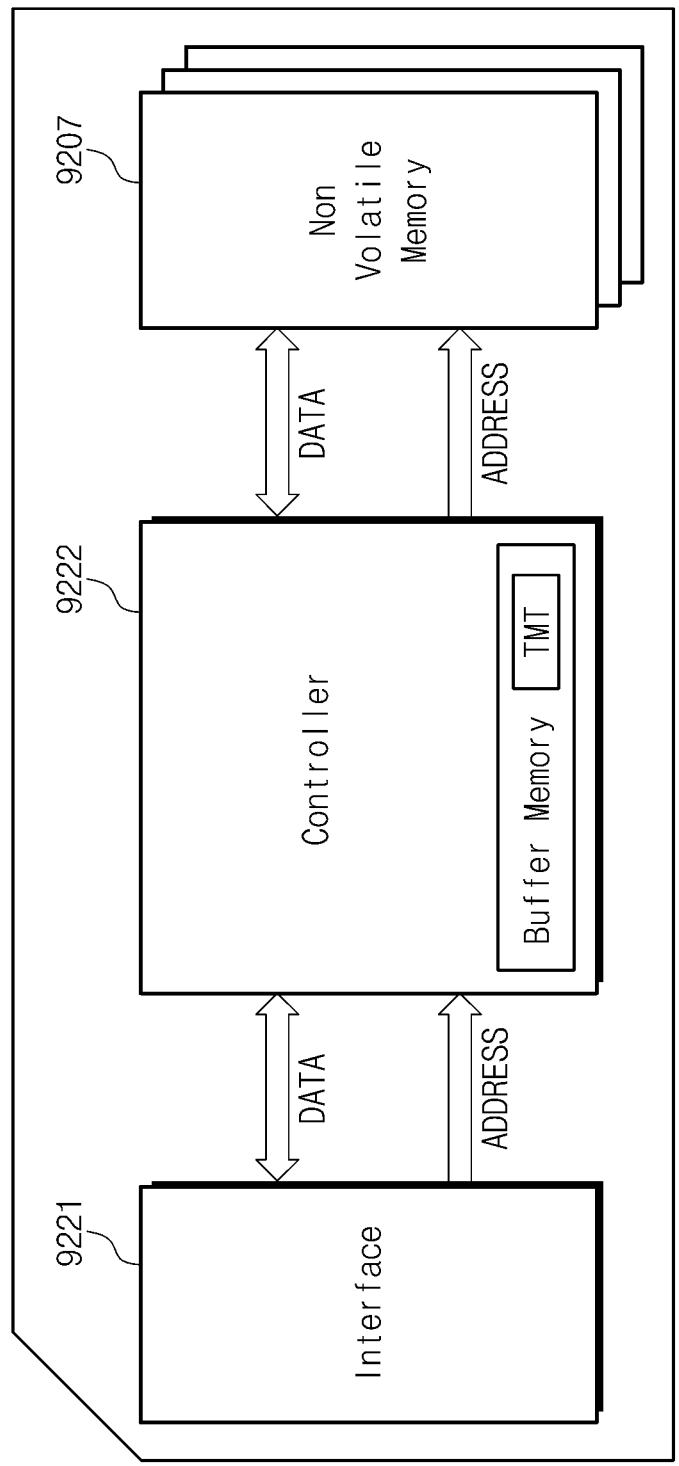
FIG. 22 is a block diagram schematically illustrating a memory card according to an embodiment of the inventive concepts.

FIG. 22 is a block diagram schematically illustrating a memory card according to an embodiment of the inventive concepts.

A memory card, for example, may be an MMC card, an SD card, a multiuse card, a micro-SD card, a memory stick, a compact SD card, an ID card, a PCMCIA card, an SSD card, a chip-card, a smartcard, an USB card, or the like.

Referring to FIG. 22, the memory card may include an interface circuit 9221 for interfacing with an external device, a controller 9222 including a buffer memory and controlling an operation of the memory card, and at least one nonvolatile memory device 9207. The controller 9222 may be a processor, which is configured to control write and read operations of the nonvolatile memory device 9207. The controller 9222 may be coupled with the nonvolatile memory device 9207 and the interface circuit 9221 via a data bus and an address bus. The interface circuit 9221 may interface with a host via a card protocol (e.g., SD/MMC) for data exchange between a host and a memory card.

The controller 9222 may be configured the same as or substantially the same as illustrated in FIG. 6, and the nonvolatile memory device 9207 may be formed of a nonvolatile memory device as illustrated in FIG. 7. For example, the controller 9222 stores a program completion time of a program requested memory area in a time mark table TMT at a program operation, and the controller 9222 determines whether information of a read requested memory area is stored in the time mark table TMT, at a read operation. When information of the read requested memory area is stored in the time mark table TMT, the controller 9222 controls the nonvolatile memory device 9207 to perform a read operation according to a read condition corresponding to a time zone of the time mark table TMT to which the read requested memory area belongs. Thus, it is possible to reduce or prevent read fail due to the fast charge loss phenomenon.

Figure 23:
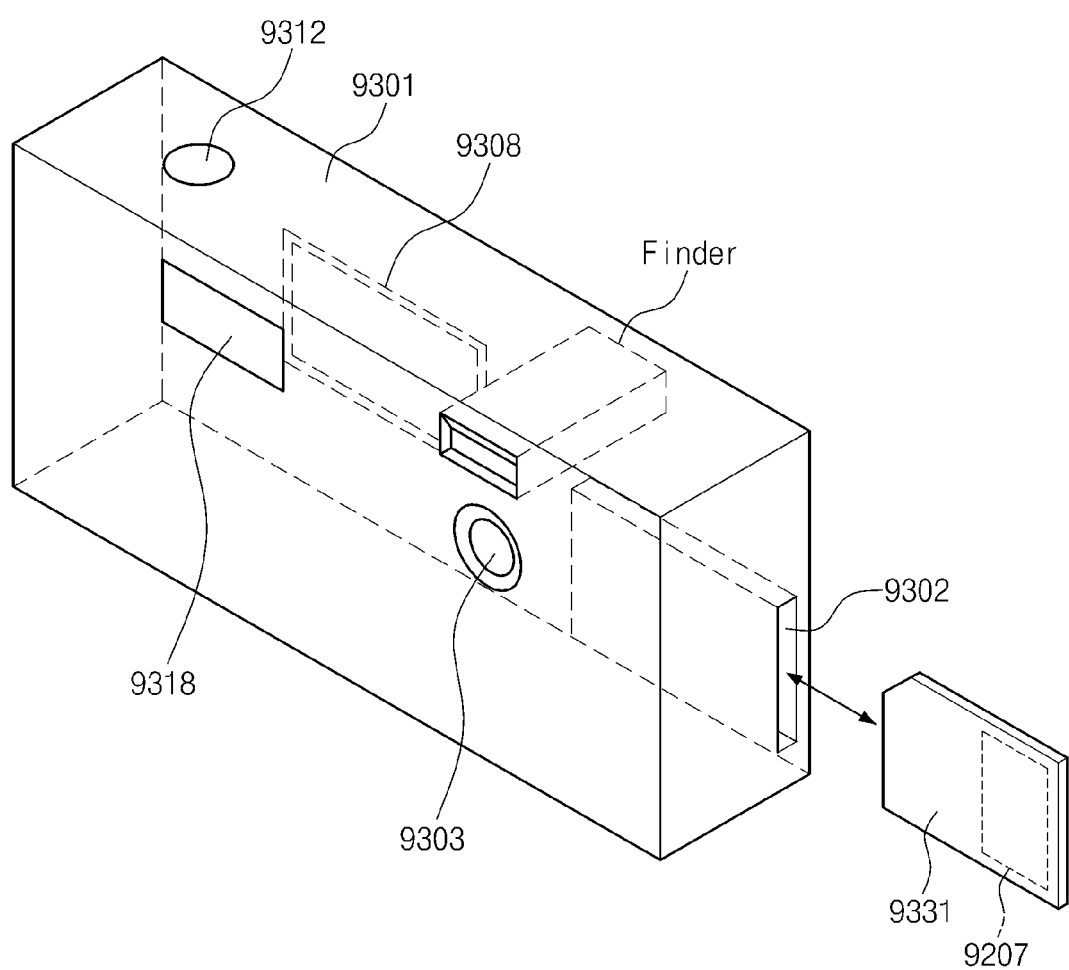
FIG. 23 is a block diagram schematically illustrating a digital still camera according to an embodiment of the inventive concepts.

FIG. 23 is a block diagram schematically illustrating a digital still camera according to an embodiment of the inventive concepts.

Referring to FIG. 23, a digital still camera may include a body 9301, a slot 9302, a lens 9303, a display unit 9308, a shutter button 9312, a strobe 9318, and the like. A memory card 9331 may be inserted in the slot 9302, and the memory card 9331 may include a memory controller as described with reference to FIG. 6 and a nonvolatile memory device as described with reference to FIG. 7. For example, the memory controller stores a program completion time of a program requested memory area in a time mark table TMT at a program operation, and the memory controller determines whether information of a read requested memory area is stored in the time mark table TMT, at a read operation. When information of the read requested memory area is stored in the time mark table TMT, the memory controller controls the nonvolatile memory device to perform a read operation according to a read condition corresponding to a time zone of the time mark table TMT to which the read requested memory area belongs. Thus, it is possible to reduce or prevent read fail due to the fast charge loss phenomenon.

If the memory card 9331 has a contact type, an electric circuit on a circuit board may be electrically contacted with the memory card 9331 when it is inserted in the slot 9302. In the event that the memory card 9331 has a non-contact type, the memory card 9331 may be accessed in a radio-frequency manner.

Figure 24:
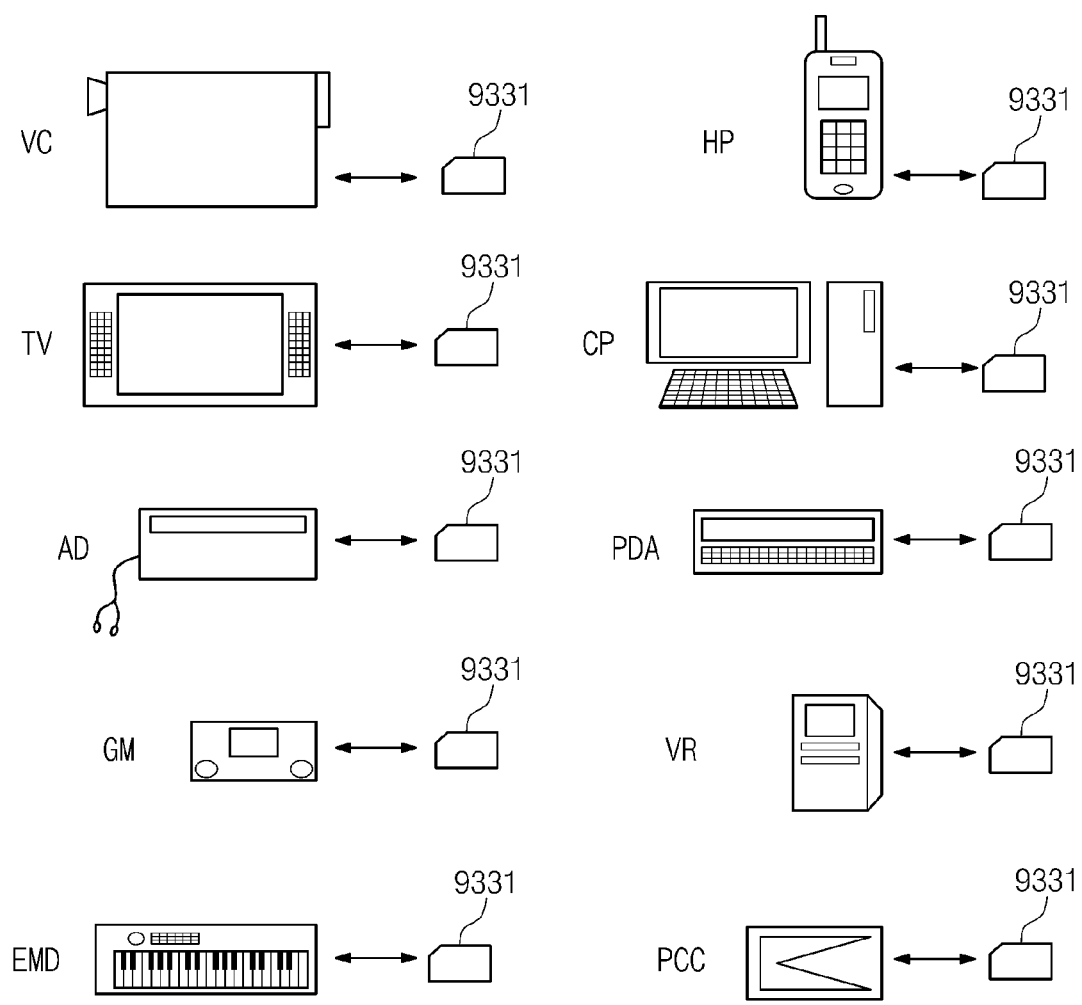
FIG. 24 is a diagram schematically illustrating various systems to which a memory card in FIG. 22 is applied.

FIG. 24 is a diagram schematically illustrating various systems to which a memory card in FIG. 22 is applied.

Referring to FIG. 24, a memory card 9331 may be applied to a video camera VC, a television TV, an audio device AD, a game machine GM, an electronic music device EMD, a cellular phone HP, a computer CP, a Personal Digital Assistant (PDA), a voice recorder VR, a PC card PCC, and the like.

In other example embodiments, memory cells can be formed of one of various cell structures having a charge storage layer. Cell structures having a charge storage layer include a charge trap flash structure using a charge trap layer, a stack flash structure in which arrays are stacked at multiple layers, a source-drain free flash structure, a pin-type flash structure, and the like.

In still other example embodiments, a memory device may have a charge trap flash structure as a charge storage layer as disclosed in U.S. Pat. No. 6,858,906 and U.S. Patent Publication Nos. 2004/0169238 and 2006/0180851, the entirety each of which is incorporated by reference herein. A source-drain free flash structure is disclosed in KR Patent No. 673020, the entirety of which is incorporated by reference herein.

A nonvolatile memory device and/or a memory controller according to the inventive concept may be packaged according to any of a variety of different packaging technologies. Examples of such packaging technologies may include PoP (Package on Package), Ball grid arrays (BOAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink. Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

While the inventive concepts have been described with reference to example embodiments, it will be apparent to those skilled in the art that various changes and modifications may be made without departing from the spirit and scope of the present invention. Therefore, it should be understood that the above embodiments are not limiting, but illustrative.

We claim:

1. A method of reading from a memory, comprising:
receiving a read request for reading data from a memory area of the memory;
determining whether an identifier of the memory area is stored in one of the plurality of entries of a characteristic table, each of the plurality of entries associated with a different range of at least one memory area characteristic and each of the plurality of entries associated with different read condition information; and
obtaining the read condition information associated with the entry storing the identifier of the memory area if the determining determines the identifier is stored in one of the plurality of entries of the characteristic table; and
controlling the memory to read data from the memory area using the obtained read condition information,
wherein the memory area characteristic is a duration or a time since the memory area was last programmed and the read condition information includes driving voltages for conducting a read operation,
wherein the memory includes a plurality of memory cell strings, and each of the memory cell strings includes a plurality of memory cells stacked in a direction perpendicular to a substrate.

2. The method of claim 1, further comprising:
moving the identifier of the memory area to a different one of the plurality of entries in the characteristic table as the memory area characteristic of the memory area changes.

3. The method of claim 1, wherein the read condition information further includes sensing condition information for conducting a read operation.

4. The method of claim 3, wherein the sensing condition information includes at least one of a bit line development time, a bit line pre-charge time, and a sensing margin.

5. The method of claim 1, further comprising:
controlling the memory to read data from the memory area based on default read condition information if the determining determines the identifier of the memory area is not in the characteristic table.

6. The method of claim 1, further comprising:
selectively changing a number of the plurality of entries in the characteristic table based on at least one of a location of a word line associated with the memory area, a program and erase cycle count associated with the memory area, a location of the memory area within the memory, a type of memory cells in the memory area, and an expected width of threshold voltage distribution of memory cells in the memory area.

7. The method of claim 1, further comprising:
selectively changing the range of the memory area characteristic associated with at least one entry of the plurality of entries in the characteristic table based on at least one of a location of a word line associated with the memory area, a program and erase cycle count associated with the memory area, a location of the memory area within the memory, a type of memory cell in the memory area, and an expected width of threshold voltage distribution of memory cells in the memory area.

8. The method of claim 1, further comprising:
removing the identifier from the characteristic table when the memory area characteristic of the memory area no longer falls within any of the ranges of memory area characteristics associated with the plurality of entries.

9. The method of claim 1, further comprising:
storing the identifier of the memory area in one of the plurality of entries of the characteristic table based on the memory area characteristic of the memory area.

10. The method of claim 9, further comprising:
performing the storing in response to a program operation for the memory area.

11. The method of claim 9, further comprising:
determining if a memory cell condition of the memory area qualifies the memory area for read condition management; and
performing the storing if the memory area is determined to qualify for read condition management.

12. The method of claim 11, wherein the determining determines the memory area qualifies for the read condition management based on a location of a word line associated with memory area.

13. The method of claim 11, wherein the determining determines the memory area qualifies for the read condition management based on a program and erase cycle count associated with memory area.

14. The method of claim 11, wherein the determining determines the memory area qualifies for the read condition management based on a location of memory area within the memory.

15. The method of claim 11, wherein the determining determines the memory area qualifies for the read condition management based on a width of threshold voltage distribution of memory cells in the memory area.

16. The method of claim 11, wherein the determining determines the memory area qualifies for the read condition management based on a type of memory cells in the memory area.

17. The method of claim 16, wherein the determining determines that the memory area qualifies for the read condition management if the type of memory cell in the memory is multi-level, and the determining determines the memory area does not qualify for the read condition management if the type of memory cells in the memory is single-level.

18. The method of claim 1, wherein the memory area is a charge trap type.

19. A memory controller, comprising:
a buffer configured to store a characteristic table, the characteristic table including a plurality of entries, each of the plurality of entries associated with a different range of at least one memory area characteristic and each of the plurality of entries associated with different read condition information; and
a processor configured to receive a read request for reading data from a memory area of the memory, determine whether an identifier of the memory area is stored in one of the plurality of entries of the characteristic table, obtain the read condition information associated with the entry storing the identifier of the memory area when the memory area qualifies for a read condition management based on a type of memory cells and when the determining determines the identifier is stored in one of the plurality of entries of the characteristic table, and control the memory to read data from the memory area using the obtained read condition information,
wherein the memory area qualifies for the read condition management if the type of memory cells in the memory is multi-level, and the memory area does not qualify for the read condition management if the type of memory cells in the memory is single-level.

* * * * *